United States Patent
Otsuki et al.

(12)

(10) Patent No.: US 6,220,871 B1
(45) Date of Patent: Apr. 24, 2001

(54) ELECTRICAL CONNECTOR AND CONTACT CONSTRUCTION THEREFOR

(75) Inventors: Tomonari Otsuki; Yasue Yamazaki, both of Tokyo (JP)

(73) Assignee: DDK Ltd., Tokyo (JP)

( * ) Notice: Subject to any disclaimer, the term of this patent is extended or adjusted under 35 U.S.C. 154(b) by 0 days.

(21) Appl. No.: 09/366,832

(22) Filed: Aug. 4, 1999

(30) Foreign Application Priority Data

| Aug. 7, 1998 | (JP) | 10-246557 |
| Sep. 4, 1998 | (JP) | 10-267393 |
| Nov. 13, 1998 | (JP) | 10-341135 |
| Feb. 24, 1999 | (JP) | 11-034958 |

(51) Int. Cl.$^7$ .................................................. H01R 9/09
(52) U.S. Cl. ................................................ 439/71
(58) Field of Search ........................ 439/70, 71, 72, 439/73, 67, 66; 174/16.3

(56) References Cited

U.S. PATENT DOCUMENTS 5,065,280 * 11/1991 Kamezor ........................ 174/16.3
5,829,988 * 11/1998 Mcmillian ........................ 439/70

* cited by examiner

*Primary Examiner*—Brian Sircus
*Assistant Examiner*—Phuong K T Dinh
(74) *Attorney, Agent, or Firm*—Baker Botts L.L.P.

(57) ABSTRACT

An electrical connector includes a first connector having a plurality of electric contacts and a second connector having a plurality of electric contact elements which are to be contacted with the electric contacts of the first connector when the first and second connectors are connected. A board of the second connector which supports its electric contact elements is formed with slits closely surrounding the respective electric contact elements. Preferably, the board consists of a first board formed with the slits described above and a second board formed with an opening having an area corresponding to the whole area of the first board provided with the electric contact elements. Alternatively, small tongue-shaped movable pieces supporting the electric contacts of the second connector are previously inclined at an angle α toward the electric contacts of the first connector, and the electric contacts of the second connector are inclined at an angle β in opposite side of the angle α in a relation α>β when the first and second connectors have been completely connected. With these construction, the electrical connector becomes compact and is able to prevent any incorrect connection between the electric contacts and the electric contact elements of the first and second connectors and to ensure the required impedance characteristics even if there are differences in height between the electric contacts of the first connector.

16 Claims, 31 Drawing Sheets

FIG_1

FIG._2

FIG_3

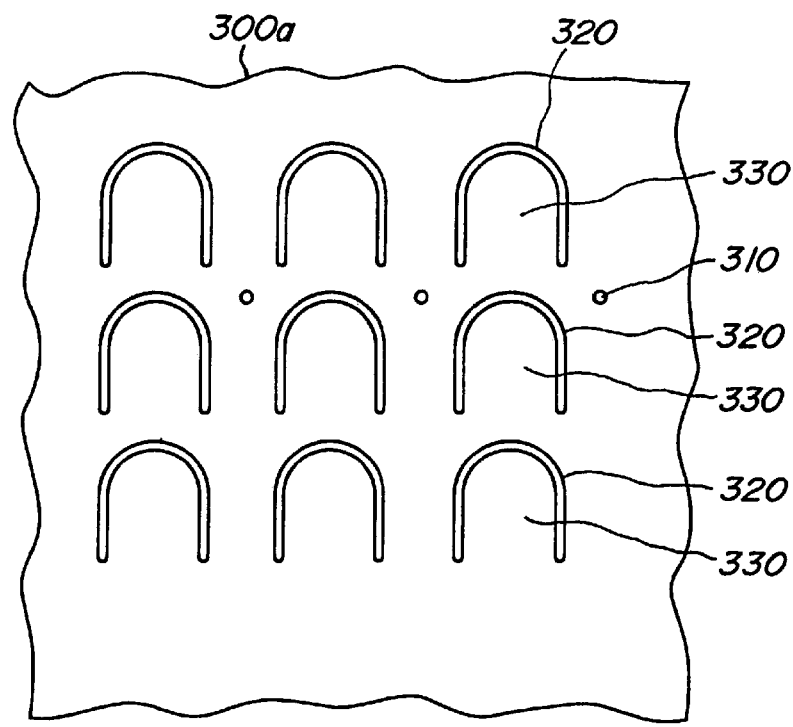
FIG_10
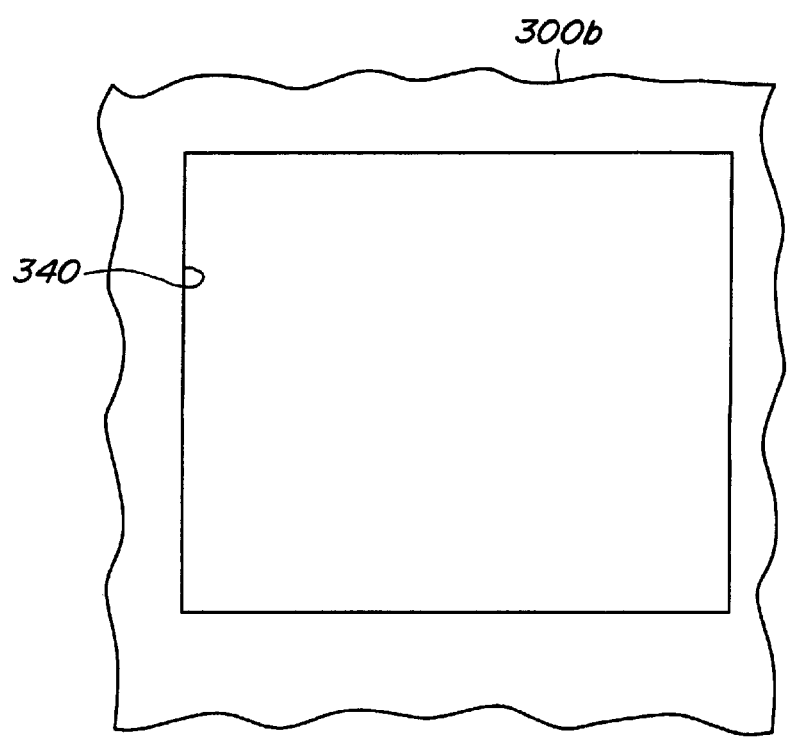
FIG_11

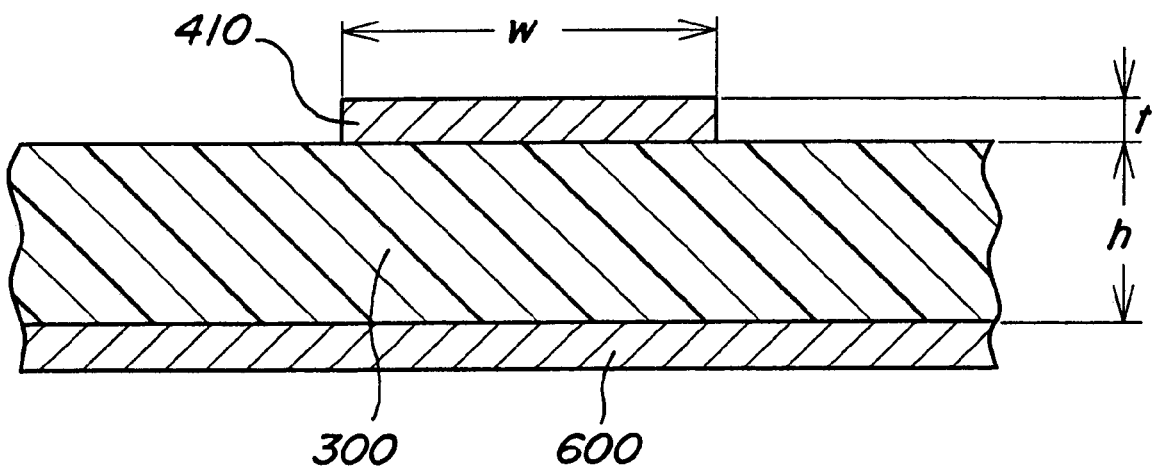
FIG_12

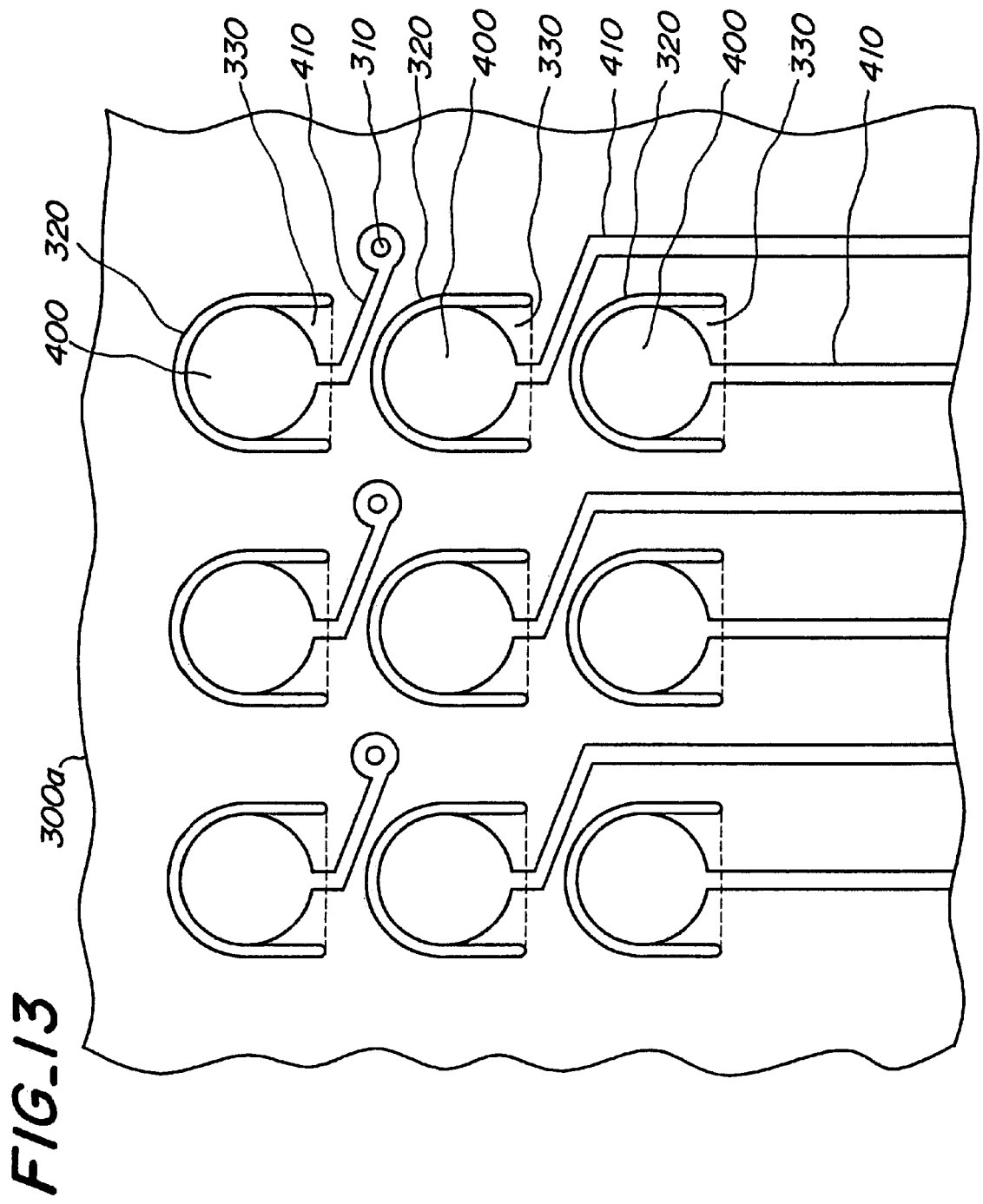
FIG_13

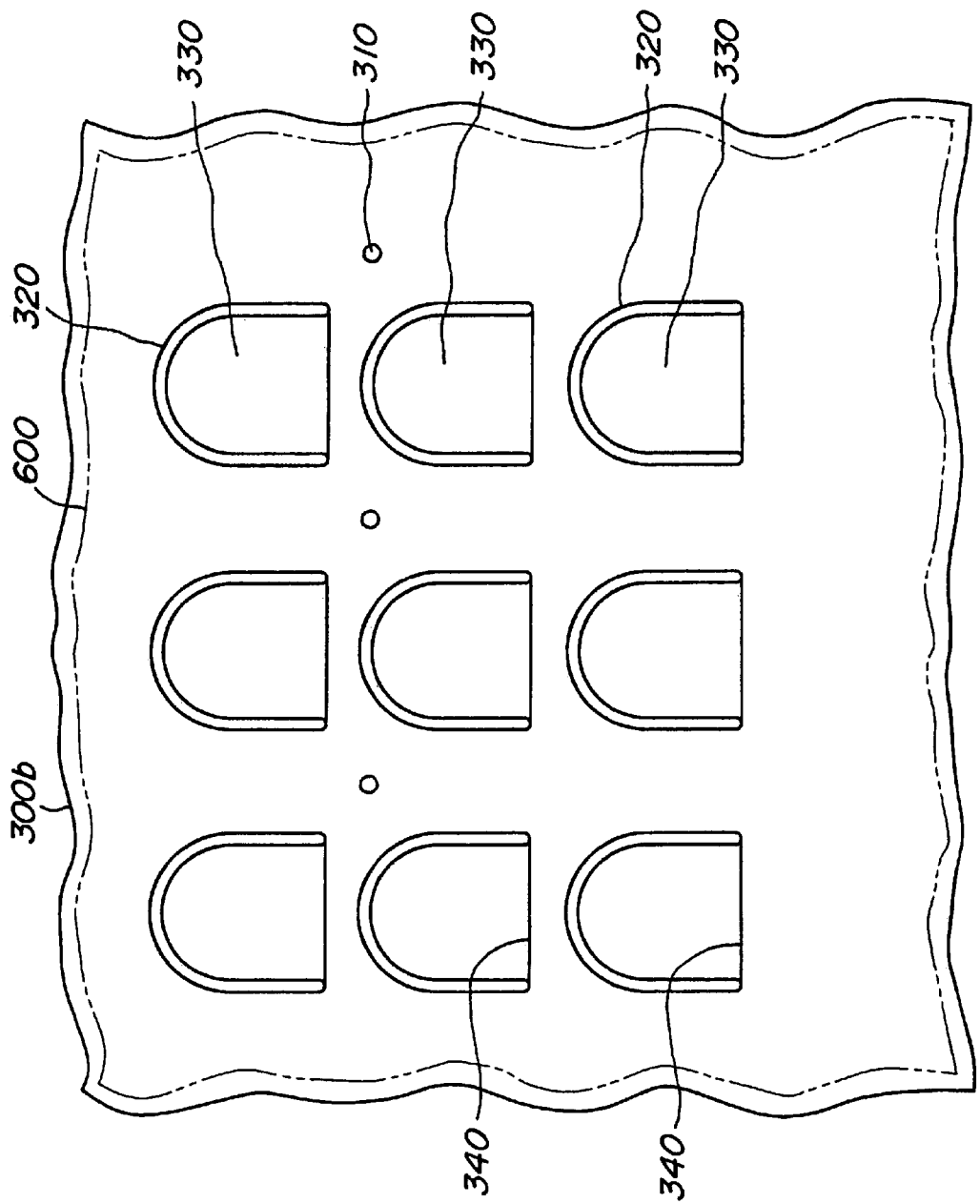
FIG._14

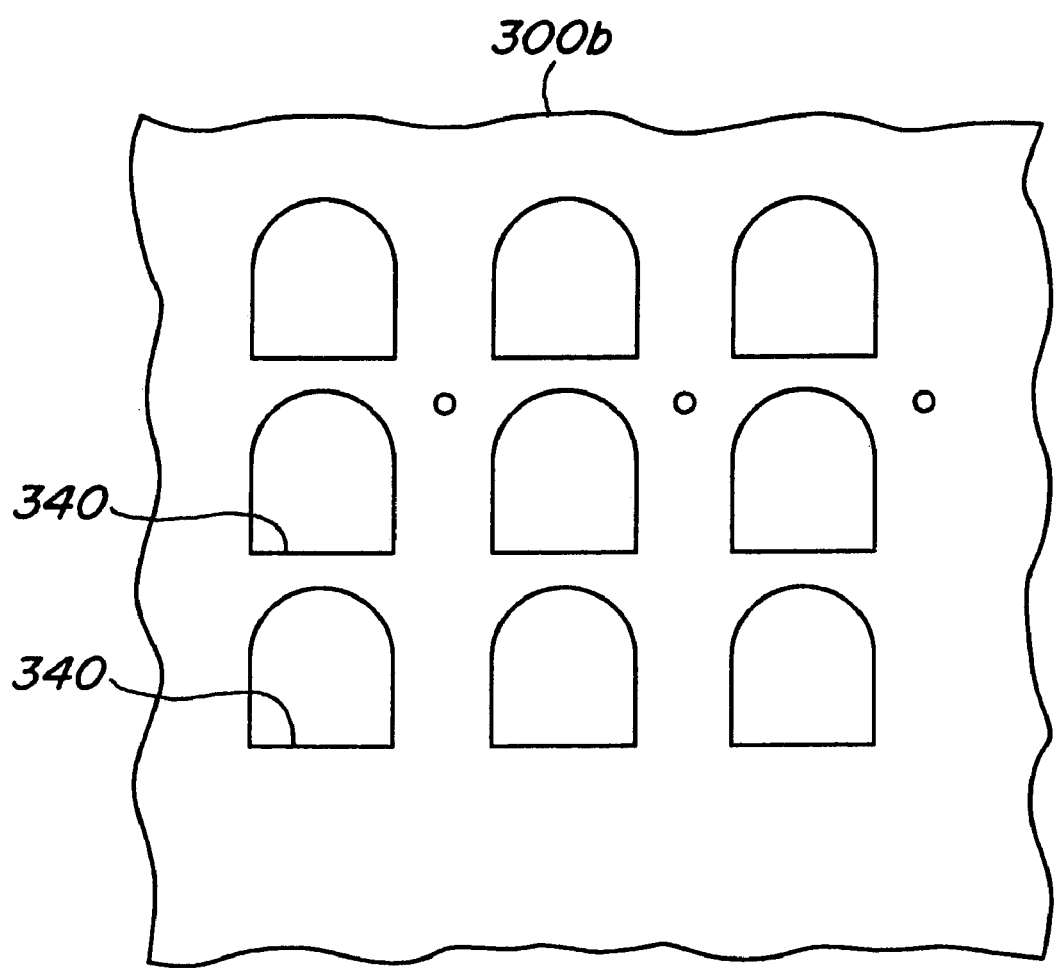
FIG._15

FIG_17A
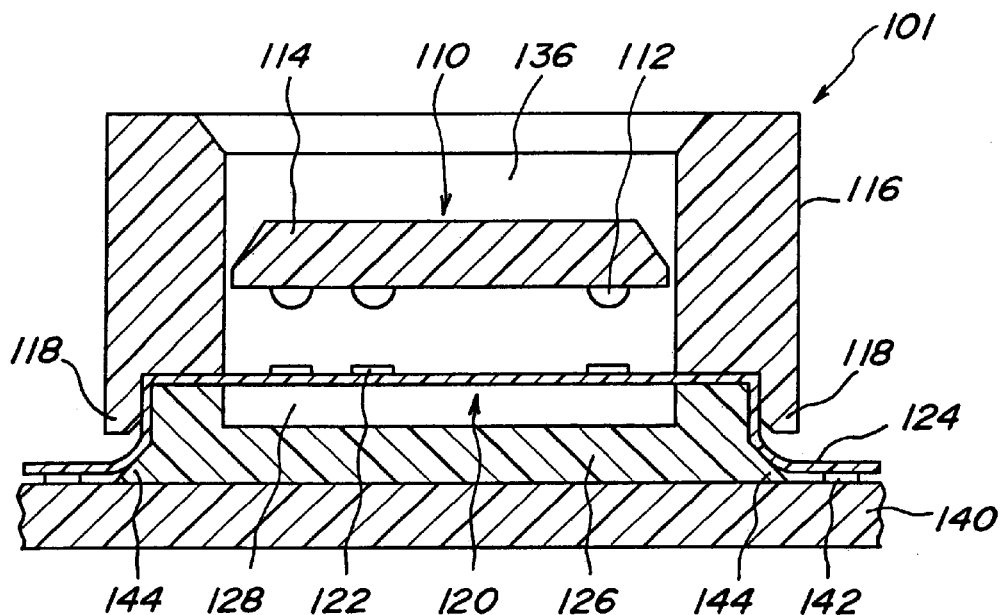
FIG_17B
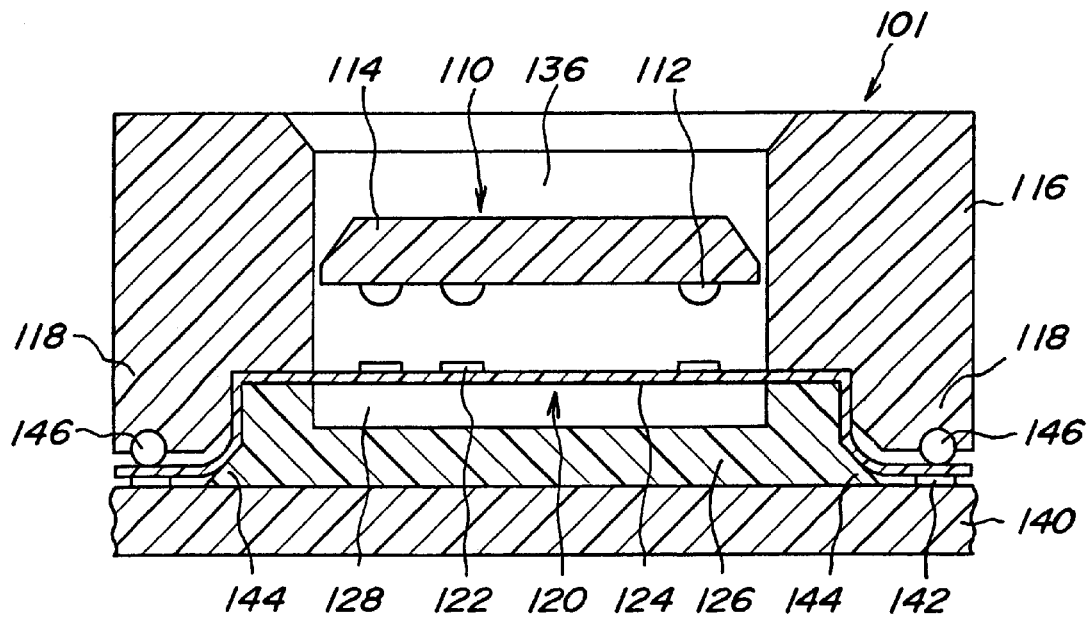

FIG_18A
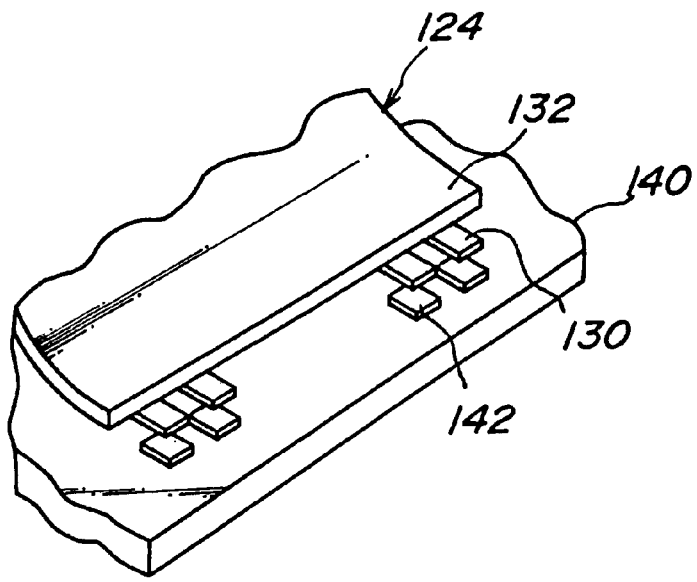
FIG_18B
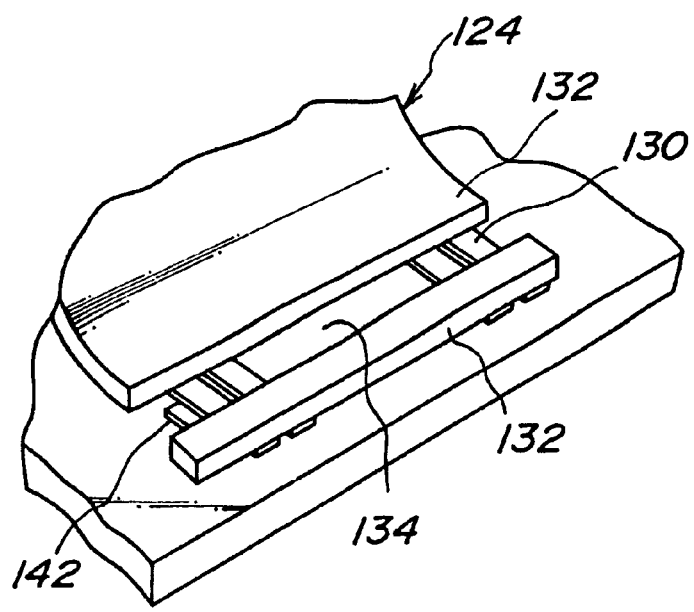

FIG_20A
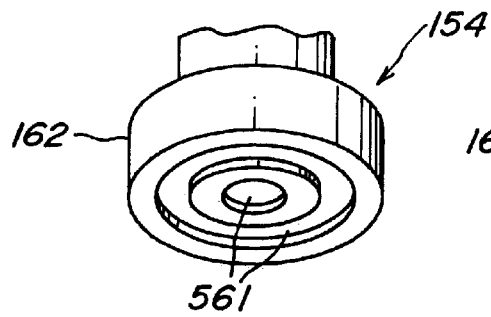
FIG_20B
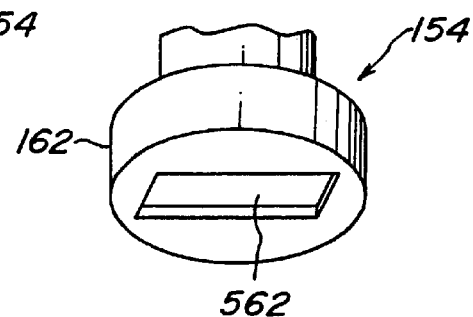
FIG_20C
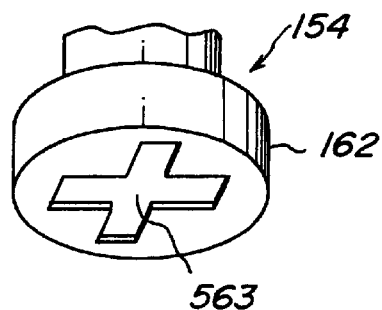
FIG_21
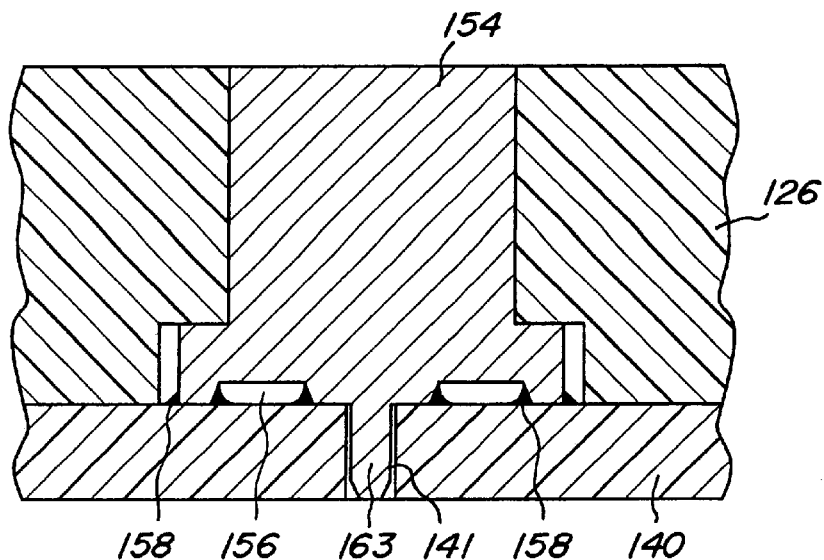

FIG_22A
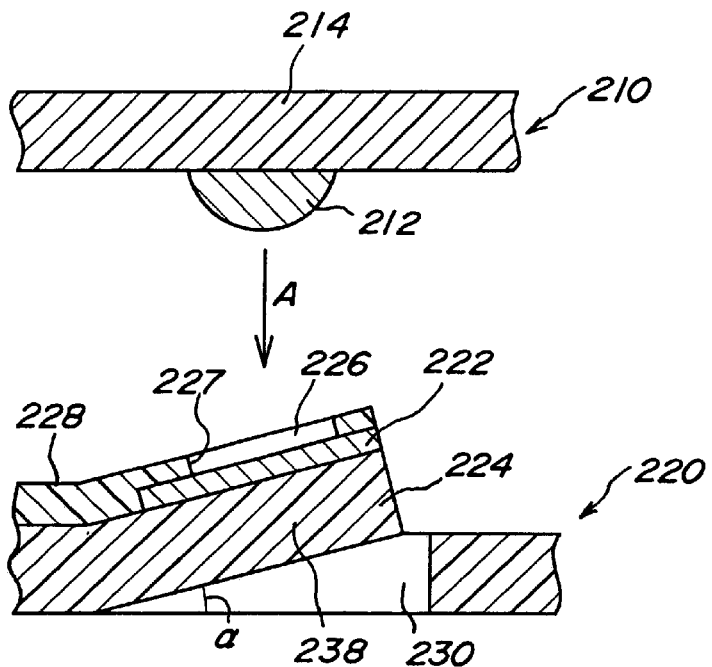
FIG_22B
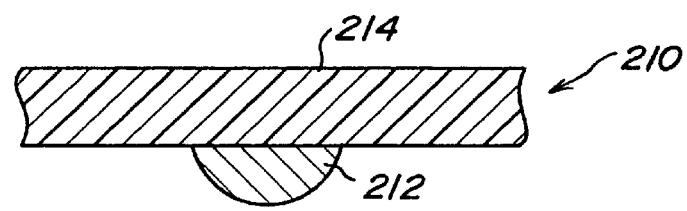
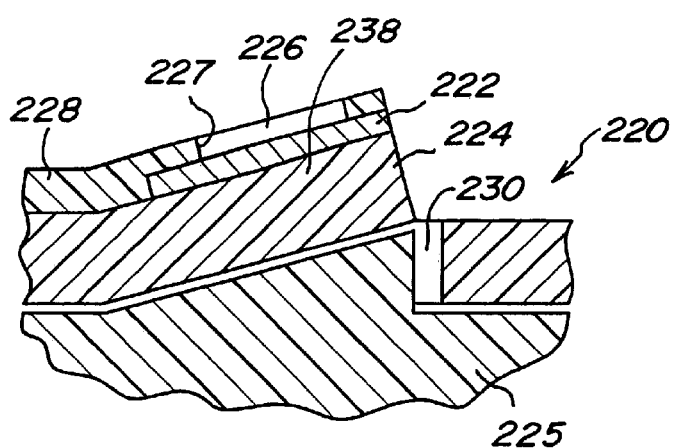

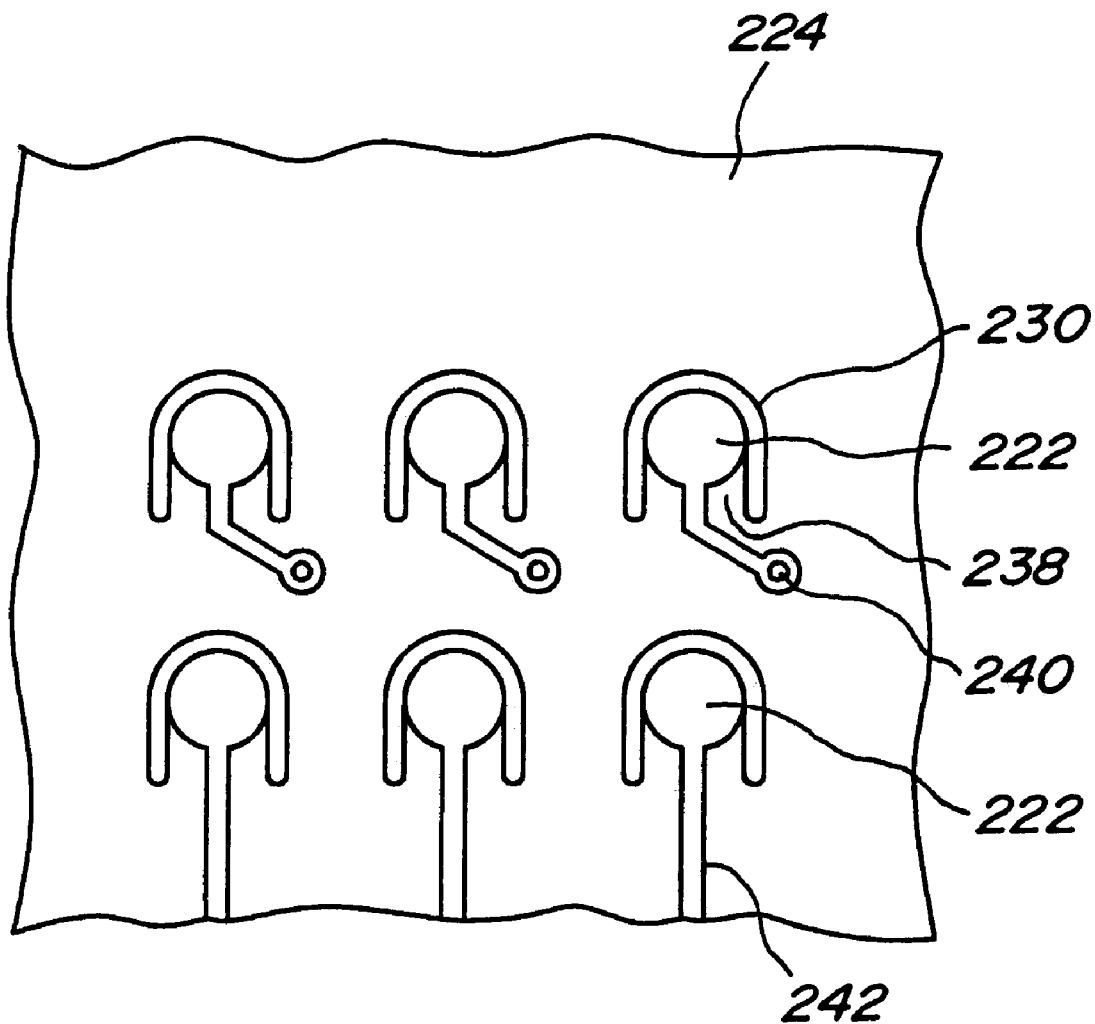
FIG_25

FIG_27
PRIOR ART
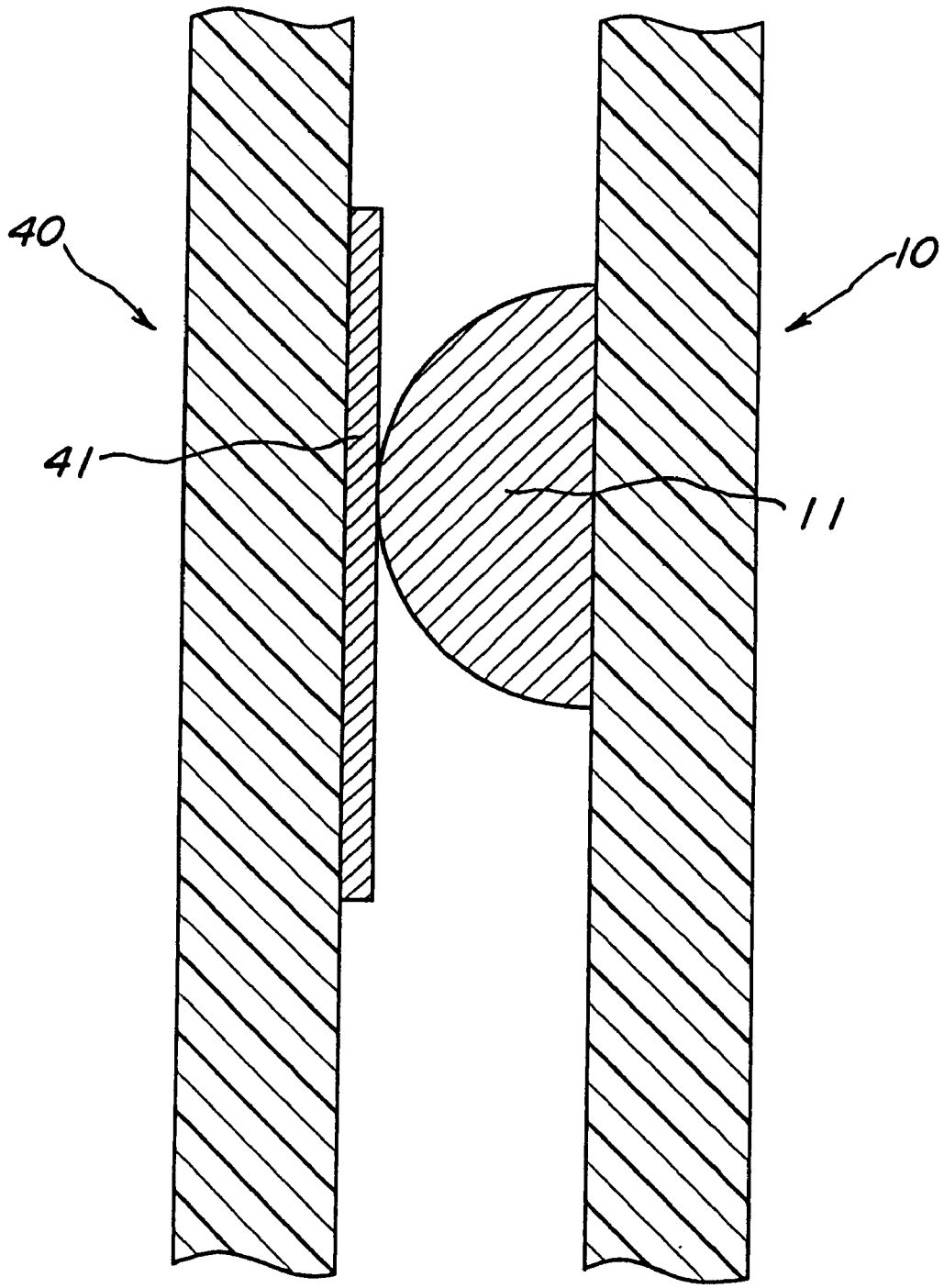

FIG_31
PRIOR ART
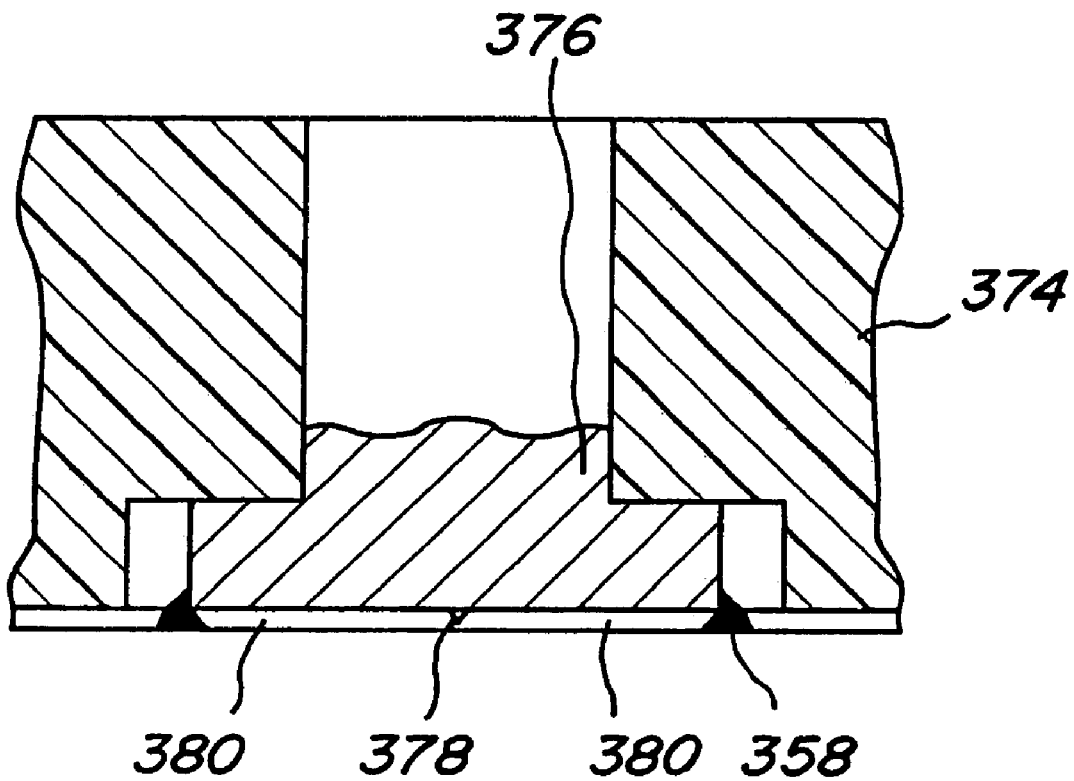

ELECTRICAL CONNECTOR AND CONTACT CONSTRUCTION THEREFOR

BACKGROUND OF THE INVENTION

This invention relates to an electrical connector including a first connector having a plurality of electric contacts and a second connector having a plurality of electric contact elements adapted to electrically contact the electric contacts of the first connector when first and second connectors are connected, and more particularly to a contact construction of an electrical connector for electrically connecting electric contacts and electric contact elements of first and second connectors of the electrical connector.

One of hitherto used electrical connectors as shown in FIG. 26 includes a first connector plate 10 and a second connector plate 20 which are brought into a detachable abutment against each other to electrically connect a plurality of electric contacts 11 made of hemispherical protrusions of solder or the like provided on one surface of the first connector plate 10 to a plurality of electric contact elements 21 provided on one surface of the second connector plate 20. Such an electrical connector has a plug and socket mechanism (not shown) for detachably connecting the first and second connector plates 10 and 20.

The first connector plate 10 is made of a ceramic or hard resin board having a rigidity and the second connector plate 20 is also made of a hard resin plate having a rigidity. The electric contact element 21 is a pin having a flange 22 and telescopically received in a contact element cylinder 30 made of a metallic material such that the pin is urged toward the electric contact 11 by an elastic member 31 such as a coil spring located in the cylinder 30. With such an electrical connector, in general, the electric contacts 11 abut against or slidably contact electric contact elements to be electrically connected to each other.

Such an electrical connector has the following disadvantages.
(1) The construction for supporting the electric contact elements 21 is complicated to increase its manufacturing cost.
(2) Owing to the construction for supporting the electric contact elements 21, the second connector plate 20 requires substantial spaces on its both sides which make it difficult to compact the electrical connector. Moreover, the contact element cylinders 30 for receiving therein the electric contact elements also somewhat require spaces which make it difficult to arrange the electric contact elements in high density.
(3) In order to avoid the disadvantage described in (2), it may be devised to provide metal foils as electric contact elements 41 on one surface of the board 40 as shown in FIG. 27. In the case providing such metal foils on the board 40, there is a risk of the electric contacts 11 and electric contact elements 41 incorrectly contacting each other due to the difference in height between the electric contacts 11 of the first connector plate 10.
(4) Furthermore, even if an impedance value, for example, of the order of 50Ω is desired between the electric contact elements 21 and grounding or earthing system (including a case having other grounding electric contact elements), the contact element cylinders 30 and the elastic members 31 would be constructionally longer with the construction shown in FIG. 26. Moreover, it may be difficult to ensure the impedance of the order of 50Ω with the dielectric constant $\epsilon_0$ of the air and the relative dielectric constant $\epsilon_1$ of a hard resin plate.

A plug and socket mechanism hitherto used is shown in FIGS. 28A and 28B to FIG. 31. As shown in FIG. 29, a first connector 310 and a second connector 320 are detachably connected by the plug and socket mechanism. The second connector 320 is embraced between a housing 372 and a block 374, and a flexible printed card board 324 extends from the housing 372 and the block 374 to be connected to pads 342 of a board 340.

With this electrical connector hitherto used, bolts 338 pass through the housing 372, the flexible printed card board 324, the block 374 and the board 340 having apertures 384 and are tightened by nuts 382 screwed onto the ends of the bolts 338, whereby these members are clamped as shown in FIG. 30A. As surface mounting components are mounted on the board 340 on the side of the nuts 382 and the apertures 384 of the board 340 are must be formed so as to avoid the area of the board 340 used for the wiring, there is a tendency for the board 340 to become large. To eliminate this problem, the bit-insert 376 has been devised which is able to be clamped by screw means, while permitting a connector to be mounted by the surface mounting method as shown in FIG. 30B.

The housing 372 is fixed by the bolts 338 to the block 74 having the bit-inserts 376 press-fitted therein. As shown in FIG. 28B, by fixing the metal layers 331 of the flexible printed card board 324 of the second connector 320 to the pads 342 of the board 340, the block 374 to which the second connector 320 and the housing 372 are fixed is mounted on the board 340. When the metal layers 331 are attached to the flexible printed card board 324 of the second connector 320 by soldering, the metal layers 331 are urged to the pads 342 of the board 340 as shown in FIG. 28B by means of a jig (not shown).

With this construction, the first connector 310 is inserted into a fitting opening 336 formed in the housing 372 to the second connector 320 secured to the board 340 and the block 374 to cause the electric contacts 312 of the first connector 310 to contact the electric contact elements 322 of the second connector 320. During such an operation, the first connector 310 is held being urged to the second connector 320 as by urging jig (not shown). Such a construction is referred to herein as "plug and socket mechanism".

The electrical connector having such a plug and socket mechanism suffers the following disadvantages.
(1) The electrical connector of this type has no means for securely urging the metal layers 331 of the flexible printed card board 324 to the pads 342 of the board 340. Moreover, the flexible printed card board 324 is inferior in followability, causing incorrect contact between the electric contacts and electric contact elements.
(2) When the metal layers 331 of the flexible printed card board 324 are urged to the pads 342 of the board 340, the metal layers 331 could not accommodate the difference in height between the pads 342. Further, there is no means for ascertaining whether the soldered surfaces are correct so that there is a risk of the adjacent leads being bridged by solder.
(3) When the bit-insert 376 of the prior art is connected to the board 340 by soldering, there is a tendency for the air 378 to enter the soldered surfaces as shown in FIG. 31, causing defects or irregularities of soldered surfaces. As a result, the strength of the soldered portions becomes lower to cause defective connection of the metal layers 331 to the flexible printed card board 324.
(4) Once the metal layers 331 of the flexible printed card board 324 has been connected to the pads 342 of the board 340 by soldering, the board 340 itself must be replaced to increase the running cost when the electric contact elements 322 of the second connector 320 have been worn off by repeated connections to and disconnections from the first connector 310.

On the other hand, if there are any contaminations or foreign substances 435 (FIG. 33A) on the electric contacts and electric contact elements, when they are caused to abut against each other, good connections therebetween could not be obtained. In order to overcome this problem, the sliding contact between the electric contacts and electric contact elements has generally been employed so that the contaminations or foreign substances on the contacting surfaces are wiped or removed by the relative movement between the electric contacts and electric contact elements.

FIG. 32 illustrates part of an electrical connector having an electric contact 412 and an electric contact element 422 to be slidably contact each other. FIG. 33A illustrates the electric contact 412 slidably moving from the position A to the position B, while moving in the direction shown by an arrow E. FIG. 33B simultaneously shows the electric contact 412 before and after it is slidably moved, respectively. FIG. 33C illustrates the electric contact 412 which is rolling as shown by an arrow F.

As shown in FIG. 32, the second connector 450 is formed with a slit 430 so that an electric contact element 422 supported by a small movable piece is lowered downwardly when the first connector 411 is urged against the second connector 450 in the direction shown by an arrow D. In more detail, the electric contact 412 of the first connector 411 contacts the electric contact element 422 of the second connector 450 at the point A at the first contacting moment as shown in FIG. 33A. Next, while the electric contact 412 is moving downwardly in the direction shown by the arrow E, the electric contact 412 slidably moves on the electric contact element 422 to the point B.

However, during such a sliding movement, the contaminations or foreign substances 435 are moved by the electric contact 412 in the sliding direction so as to accumulate higher. As a result, the electric contact 412 tends to ride over the accumulation so that the electric contact 412 is rolled or inclined to cause a defective connection between the electric contact 412 and the electric contact element 422.

SUMMARY OF THE INVENTION

It is an object of the invention to provide an improved electrical connector which is simple in construction, able to be compacted, and capable of preventing any defective contact due to difference in height between electric contacts, and can obtain a required impedance characteristics with ease.

It is another object of the invention to provide an improved electrical connector which is able to easily urge metal layers of a flexible printed card board to pads of a board, superior in followability of the flexible printed card board, capable of ascertaining soldered conditions, easy to replace flexible printed card boards and free from defective connection.

It is a further object of the invention to provide a contact construction of an electrical connector, which causes electric contacts of a first connector to contact electric contact elements with high stability without riding of the electric contacts over accumulated foreign substances even if the electric contacts are rolled forwardly in their sliding direction.

In order to accomplish these objects, in an electrical connector including a first connector having a plate and a plurality of electric contacts provided on one surface of the plate, a housing having a fitting opening for the first connector, a second connector to be detachably connected to said first connector and having a plurality of electric contact elements provided on one surface of the second connector and a block on which said second connector is mounted, said electric contacts and said electric contact elements of the first and second connectors to be electrically connected with each other, according to the invention said electric contact elements of the second connector are provided on a board of the second connector, and said board is formed with slits closely around said electric contact elements, thereby enabling the board to support the electric contact elements elastically.

In a preferred embodiment of the invention, the board of the second connector is provided with an elastomer layer on the opposite side of the electric contact elements.

Preferably, the electric contact elements of the second connector are provided on the board by the printed circuit forming method.

More preferably, metal conductors are provided on the board of the second connector on the opposite side of its electric contact elements and electrically connected to these electric contact elements.

Preferably, the board of the second electrical connector is a flexible printed card (FPC) board. By providing such a flexible printed card board, the board of the second connector can be easily produced.

In order to cope with repeated connections and disconnections of great many times, it is needed to maintain the elasticity stably at the electric contact elements. Therefore, boards on which electric contact elements are formed are preferably as thin as possible. On the other hand, there are often the cases requiring impedance characteristics (for example, impedance value of the order of 50Ω) by applying the microstrip line design between lead lines composed of metal layers of electric contact elements and metal conductors on the opposite side of the board for grounding, depending upon of applications of electrical connectors.

In such cases, in order to cope with repeated connections and disconnections of the first and second connectors, the board is needed to be thinner to maintain the elasticity stably at the electric contact elements described above. However, when the board becomes thinner, the width of lead lines must be narrower. With too narrow width of the lead lines, transmission losses of signals would tend to occur. In other words, in the design of the microstrip line, the thickness of a board (elasticity in the proximity of electric contact elements) and the width of lead wires (transmission losses of signals) are incompatible with each other.

In order to eliminate this problem, in a preferred embodiment of the invention, the board of the second connector has a thinner region corresponding to the area including the plurality of the electric contact elements of the second connector to support the electric contact elements elastically, from which electric contact elements metal layers as lead wires extend, and metal conductors are provided on said board of the second connector on the opposite side of its electric contact elements.

Preferably, the portions of the board of the second connector surrounded by the slits are thinner than the other portion of the board.

More preferably, the electrical connector comprises a plate elastically supporting the electric contact elements by thinner portions of the plate surrounded the slits.

In order to overcome the disadvantages of the electrical connector having a plug and socket mechanism described above, according to the invention, the housing is provided on its both sides with projections for urging the flexible printed card board against the board, on which both sides ends of the flexible printed card board extend, and bit-inserts are secured to the block of the second connector as means for causing the housing of the first connector to engage the block.

Preferably, said block is provided with tapered portions on which both sides ends of said flexible card board extend for guiding the flexible printed card board. By providing the tapered portions, the flexible printed card board's followability is improved so that the flexible printed card board can be easily urged against the pads of the board.

In a preferred embodiment, that part of an insulating layer of the flexible printed card board which is urged against pads of a board of the second connector is removed. By removing the part of the insulating layer, the connected condition of the metal layers of the flexible printed card can be visually ascertained.

Preferably, that part of an insulating layer of said flexible printed card board which is urged against pads of a board of said second connector is removed, leaving the other part of the insulating layer located at the end of the flexible printed card board. In this manner, the connected condition of the metal layers of the flexible printed card board can be visually ascertained to improve the positional accuracy of the metal layers on the flexible printed card board and to prevent the solder from bridging between the adjacent soldered portions.

In one embodiment of the invention, the bit-insert is provided with a recess at its bottom for releasing the air and increasing solder fillets. By providing the recess for increasing solder fillets, stable connection can be achieved without tilting of the connector and the strength of connection can be increased.

In another embodiment of the invention, said bit-insert is provided with a positioning pin at the center of its bottom for positioning said board of the second connector. By providing the positioning pin, the electrical connector can be easily positioned on the board.

In a further embodiment of the invention, the housing is provided with urging members in the projections of the housing for urging the flexible printed card board to pads of the board of the second connector. By providing the urging members, the flexible printed card board can be fixed to a board without using the soldering.

In one aspect of the invention, in a contact construction of an electrical connector including a first connector having a plate and a plurality of electric contacts provided on one surface of the plate, a housing having a fitting opening for the first connector, a second connector to be detachably connected to said first connector and having a plurality of electric contact elements provided on one surface of the second connector and a block on which said second connector is mounted, said electric contacts of the first connector and said electric contact elements of the second connector to be electrically connected to each other, according to the invention, a board supporting said plurality of electric contacts of the second connector is formed with slits for elastically supporting said electric contact elements, and said electric contact elements of the second connector are arranged such that these electric contact elements are inclined at an angle of $\alpha$ toward the electric contacts of the first connector before the electric contacts and the electric contact elements of the first and second connectors have not contacted, and said electric contact elements of the second connector are inclined at an angle of $\beta$ on the opposite side of the angle $\alpha$ with a relation of $\alpha>\beta$ when said first and second connectors have been connected.

With this construction, the defective connection between the electric contact and the electric contact element can be eliminated, which would otherwise be caused by the riding or rolling of the electric contact over the accumulation of foreign substances wiped by the sliding movement of the electric contact.

Preferably, said angle of $\alpha$ is within a range of 10° to 30°, and said angle of $\beta$ is 1° to 3° less than the angle $\alpha$.

The electrical connector and the contact construction thereof according to the invention have the following significant advantages.

(1) The board on which the electric contact elements are provided is partially cut to form slits closely around the electric contact elements, thereby elastically supporting them. Therefore, electrical connector can be manufactured with extremely low cost. Particularly, the manufacturing cost can be considerably reduced when the electric contact elements are made by the printed circuit forming method.

(2) According to the invention a great number of electric contact elements can be formed on a second connector without requiring large space, so that the electrical connector can be compacted to a great extent in comparison with those of the prior art. Moreover, by forming the electric contact elements by means of the printed circuit producing method, it becomes easier to arrange them in higher density.

(3) According to the invention, the electric contact elements are elastically supported by the elasticity of the inherent member without using any other mechanical parts, so that the electric contacts and the electric contact elements can achieve good contacting condition with high reliability without being affected by difference in height between the electric contacts. Particularly, in case of interposing the elastomer layer between the board on which the electric contact elements are formed and the back-up plate, the electric contact elements are supported in better elastic condition to obtain the more stable contact condition.

(4) According to the invention, the metal conductors are provided on the board on the opposite side of the electric contact elements for grounding or earthing. In this case, the impedance between the electric contact elements for signals and earthing can be easily adjusted by applying the microstrip line design. For example, the impedance value of the order of 50Ω can be easily set which would be difficult in the prior art.

(5) When the plate portion of the second connector is constructed only by a board formed with electric contact elements, the number of parts can be considerably reduced to lower the manufacturing cost.

(6) According to the invention, the board of the second electrical connector is cut to form slits closely around the electric contact elements, while the board is made thinner over the area provided with the plurality of electric contact elements, thereby elastically supporting the electric contact elements. Moreover, the lead wires of the metal layers extend from the electric contact elements, and the metal conductors for earthing are provided on the board on the opposite side of the electric contact elements. Therefore, the electric contact elements are elastically supported, even if the entire thickness of the board is thick. Moreover, by applying the microstrip line design, the transmission losses are limited to the minimum to obtain a required impedance characteristic (for example, the impedance value of the order of 50Ω) with ease.

(7) According to the invention, as only the parts of the board surrounded by the slits are made thinner, the board has a sufficient durability and the entire board can be made thinner or the space can be saved.

(8) The features of the invention of providing the slits around the electric contact elements and thinner parts of the board surrounded by the slits can be applicable to electrical connector having boards.

(9) According to the invention, by providing the projections on the housing, the followability is given to the flexible printed card board to avoid any defective connection.

(10) By removing the part of the insulating layer in the proximity of the connection of the flexible printed card board and corresponding to the pads of the board, the positional shifting of lead portions can be visually ascertained and the soldered connections can be ascertained.

(11) By removing the part of the insulating layer with exception of its end, the connections can be visually ascertained to easily maintain the accuracy of the pitch of the metal layers and to prevent the solder from bridging between the adjacent soldered portions.

(12) By using the bit-inserts, the electric contact elements can be arranged in higher density on the board, and the housing can be easily removed from the block for cleaning the electric contact elements and other purposes.

(13) According to the invention, by providing the recess in the bottom of the bit-insert, even if the air enters the soldering portions, it can escape into the recess to prevent defective or irregular soldering, thereby ensuring stable soldering and increasing soldering strength.

(14) According to the invention, by providing the positioning pin, the electrical connector can be easily positioned on the board.

(15) According to the invention the housing is provided with urging members in its projections at locations corresponding to the pads of the board. As a result, there is no need for soldering the flexible printed card board and pads of the board, and the second connector can easily be replaced when the electric contact elements of the second connector have been worn off due to repeated connections and disconnections.

(16) According to the invention a board supporting the electric contact element is formed with slits for elastically supporting the electric contact elements, and the electric contact elements are inclined at an angle of $\alpha$ toward the electric contacts before they have contacted each other, and the electric contact elements are inclined at an angle of $\beta$ on the opposite side of the angle $\alpha$ with the relation of $\alpha > \beta$ when the electric contacts and electric contact elements have contacted each other. With this construction, even if the electric contacts are rolling, the stable connection can be achieved because of no accumulation of foreign substances at the rolling position.

(17) With the construction achieving the relation of $\alpha > \beta$, the electric contacts of the first connector will contact the electric contact elements and move in one direction on the electric contact elements, and then return in opposite direction during which the inclined angle of the electric contact elements changes from $\alpha$ to $\beta$. Therefore, the electric contacts remain stationary at the moment just before starting their returning movement. As a result, there are no accumulation of foreign substances at the locations where the electric contacts and the electric contact elements finally contact each other.

The invention will be more fully understood by referring to the following detailed specification and claims taken in connection with the appended drawings.

BRIEF DESCRIPTION OF THE DRAWINGS

FIG. 10 is a partially enlarged plan view of one of the hard resin plate of the board shown in FIG. 7;

FIG. 11 is a partially enlarged plan view of the other hard resin plate of the board shown in FIG. 7;

FIG. 12 is a view for explaining the relation between the thickness of the board and thickness and width of lead wires with a required impedance value;

FIG. 13 is a partially enlarged plan view of the board of the second connector of another embodiment of the electrical connector according to the invention;

FIG. 14 is a partially enlarged plan view of the board shown in FIG. 13 viewing from its rear side;

FIG. 15 is a partially enlarged plan view of the hard resin plate of the board shown in FIG. 13;

FIG. 17A is a sectional view of the electrical connector shown in FIG. 16 taken along its longitudinal center line;

FIG. 17B is a sectional view of a modification of the electrical connector shown in FIG. 17A;

FIG. 18A is a partial perspective view illustrating the connection with the board according to the invention;

FIG. 18B is a partial sectional view illustrating one modification of the connection shown in FIG. 18A;

FIG. 20A is a perspective view illustrating another feature of the flange of the bit-insert shown in FIG. 19A;

FIG. 20B is a perspective view showing a modification of the flange of the bit-insert shown in FIG. 20A;

FIG. 20C is a perspective view showing another modification of the flange of the bit-insert shown in FIG. 20A;

FIG. 21 is a sectional view of a bit-insert provided with a positioning pin at the center of its bottom and mounted in the block and board;

FIG. 22A is a partial sectional view of an electric contact and an electric contact element of a modified electrical connector according to the invention;

FIG. 22B is a partial sectional view illustrating the board shown in FIG. 22A provided with an elastic member attached thereto;

FIG. 25 is a partial plan view of the electrical connector shown in FIG. 22A;

FIG. 27 is a partially enlarged longitudinal sectional view illustrating another electrical connector of the prior art;

FIG. 31 is a sectional view of a block into which a bit-insert of the prior art has been press-fitted;

DESCRIPTION OF THE PREFERRED EMBODIMENTS

Figure 1:
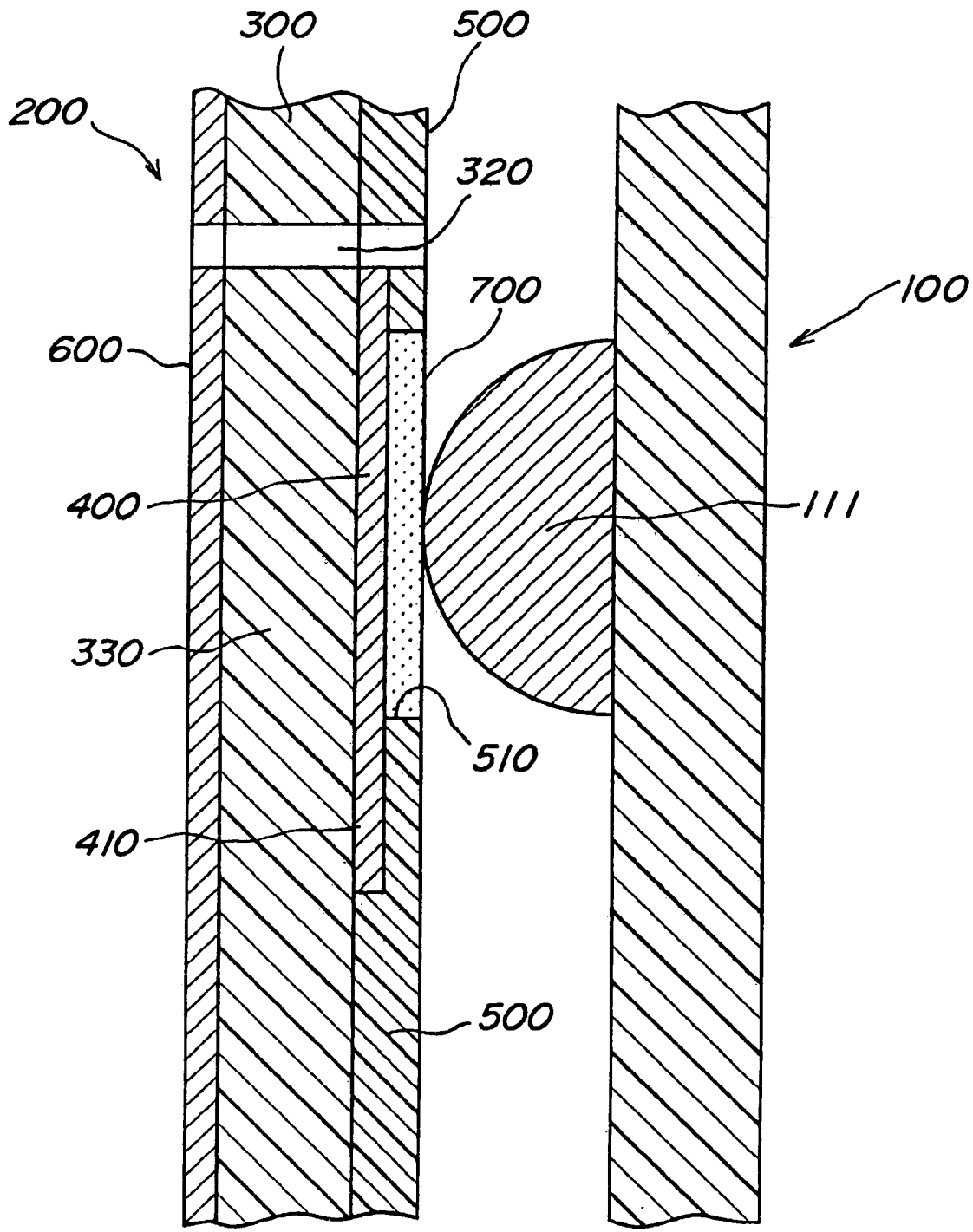
FIG. 1 is a partially enlarged longitudinal sectional view of one embodiment of the electrical connector according to the invention.

First, the construction of first and second connectors of the electrical connector according to the invention will be explained. FIGS. 1 to 5 illustrate one preferred configuration of the electrical connector according to the invention. In the drawings, a first connector plate 100 made of a ceramic or hard resin substrate or board having a rigidity is provided on one surface with a plurality of electric contacts 111 of hemispherical protrusions of solder or the like, while a second connector plate 200 comprises a substrate or board 300 made of a hard resin or the like having an appropriate rigidity, a plurality of electric contact elements 400 of disc-shaped metal layers on one surface of the board 300, and a protection covering layer 500 of an insulating material provided on the side of the electric contact elements 400.

In the illustrated electrical connector, the first and second connector plates 100 and 200 are detachably connected to each other utilizing a plug and socket mechanism in the conventional manner. The plug and socket mechanism used in the present invention will be explained later. Needless to say, on the first connector plate 100 on the opposite side of the electric contacts 111 there are provided required wirings such as printed circuits connected to the electric contacts 111.

Figure 2:
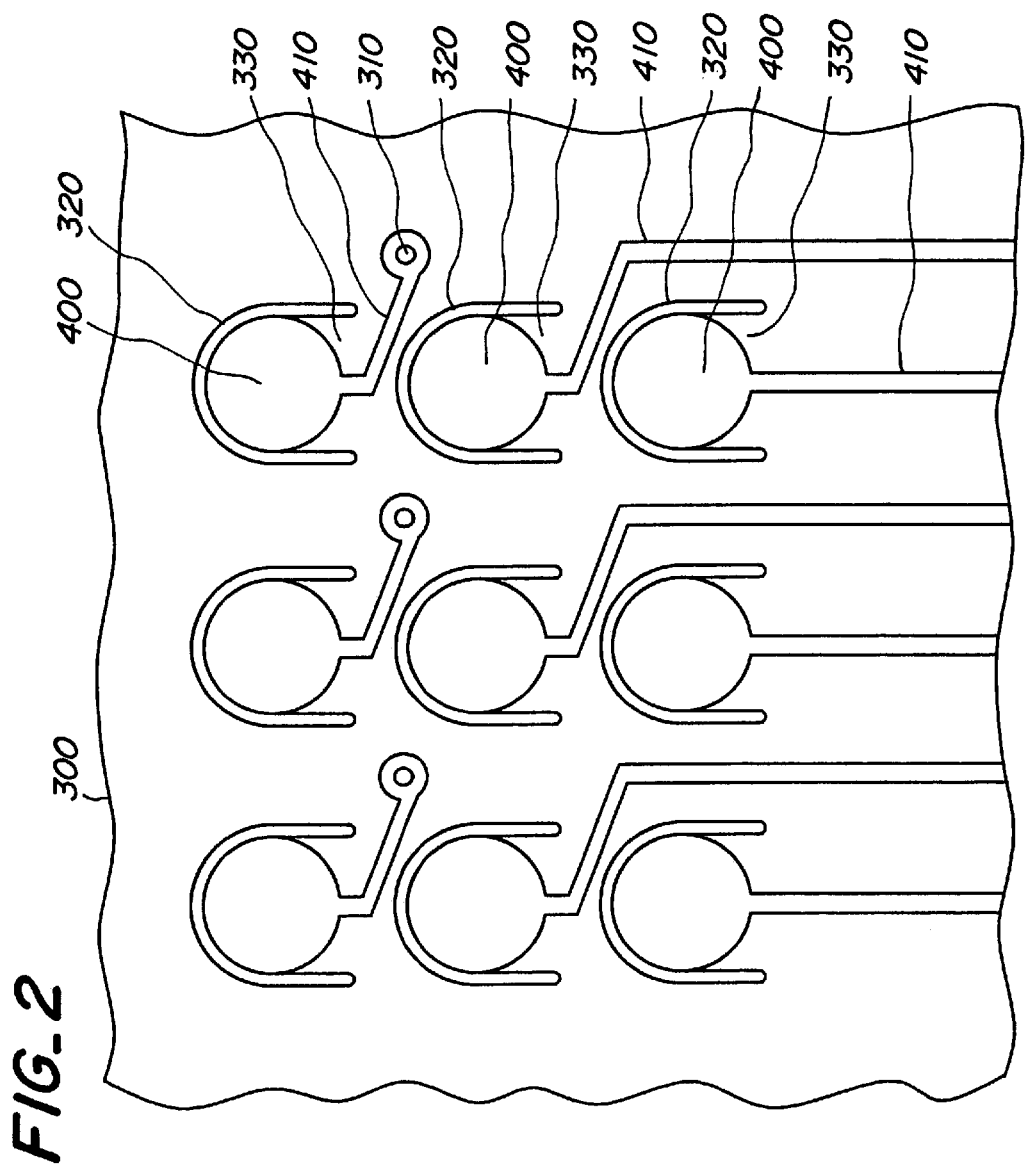
FIG. 2 is a partially enlarged plan view of the board of the second connector of the electrical connector shown in FIG. 1.

According to the invention, as shown in FIG. 2 the required electric contact elements 400 are provided on one surface of the board 300 for example by treating a metal layer such as a copper foil previously provided thereon by means of the printed circuit forming method which is one of the board producing techniques.

Therefore, a great number of electric contact elements 400 can be produced extremely inexpensively without requiring large space. Also lead wires 410 to be connected to the electric contact elements 400 may of course be produced by the printed circuit forming method. In the case of lack of space for arranging the lead wires 410 due to the electric contact elements arranged in a high density, the lead wires 410 may be formed on the rear surface of the board 300 so as to communicate with through-holes 310 provided at appropriate locations in the board 300.

Figure 3:
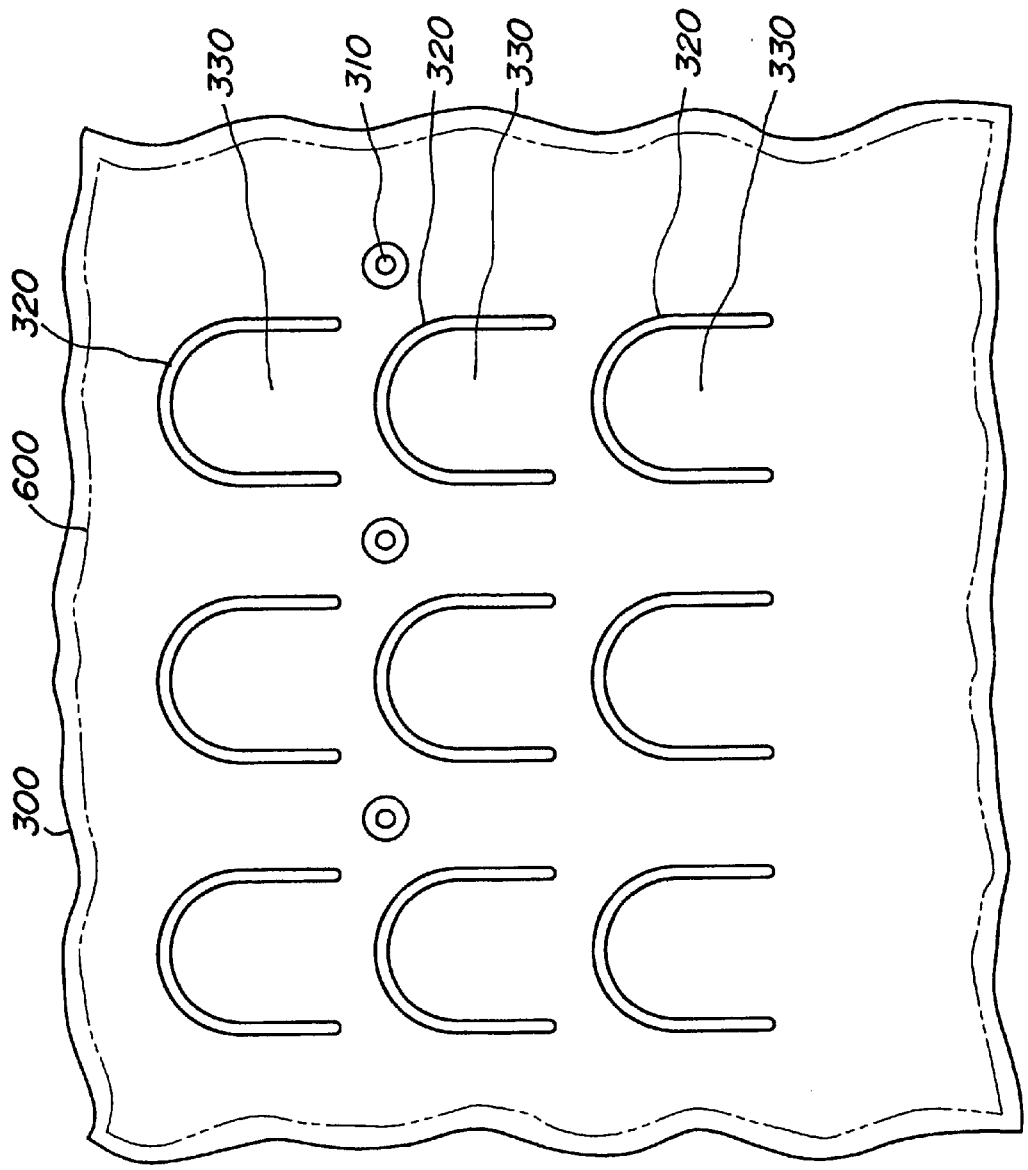
FIG. 3 is a partially enlarged plan view of the board shown in FIG. 2 viewing on the rear side thereof.
Figure 4:
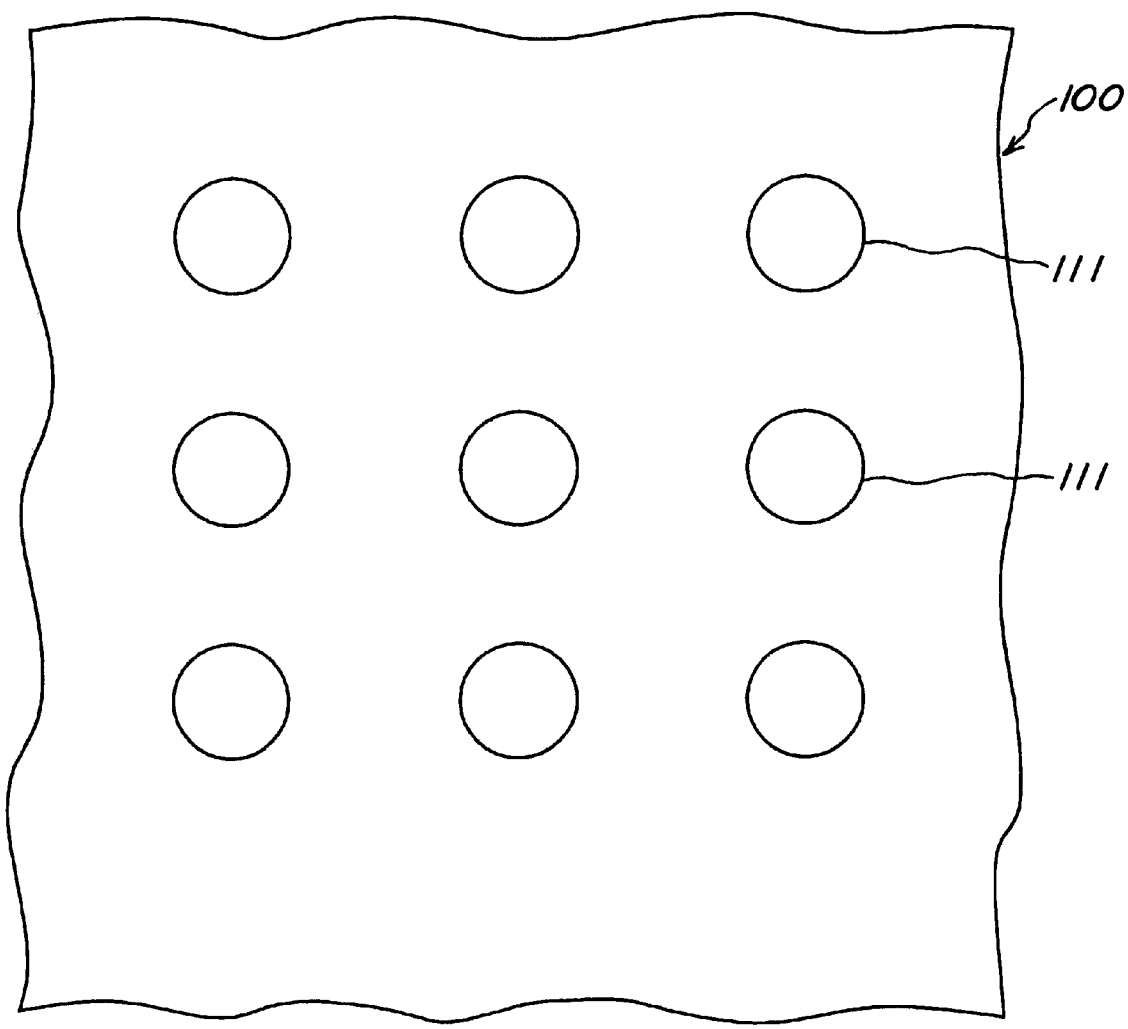
FIG. 4 is a partially enlarged plan view of the board of the first connector of the electrical connector shown in FIG. 1.
Figure 5:
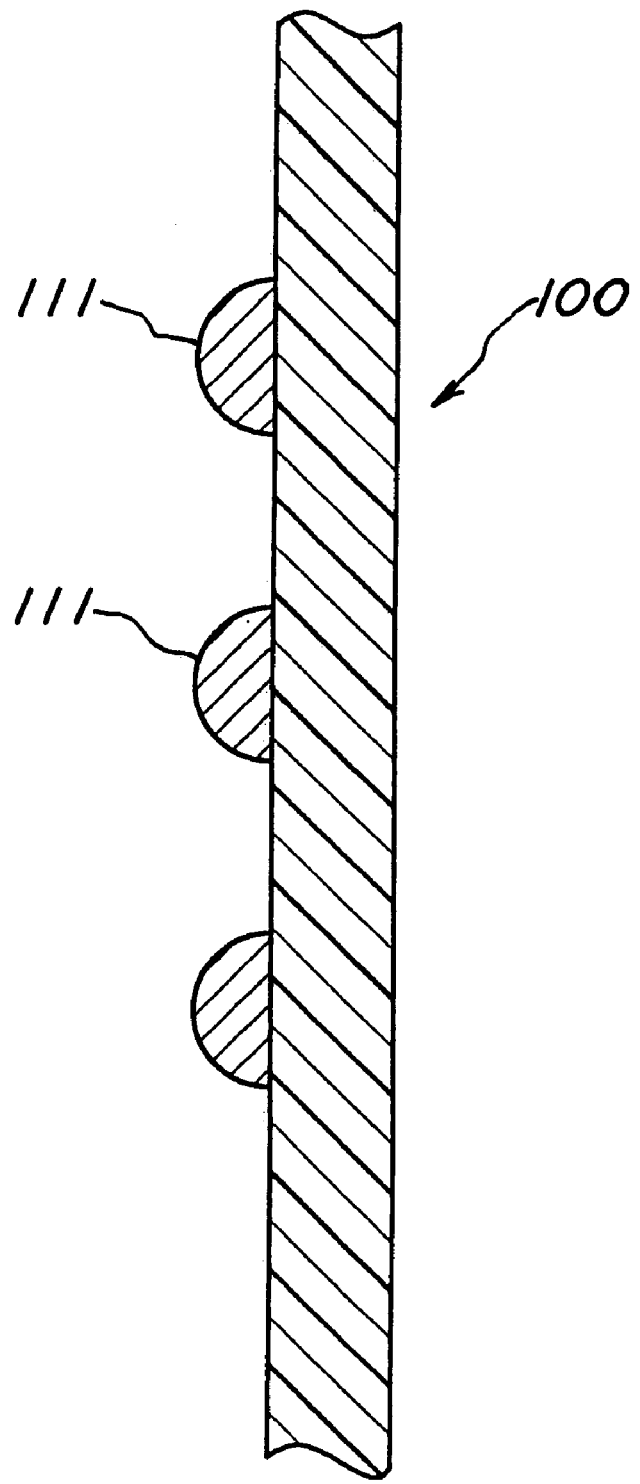
FIG. 5 is a partially enlarged longitudinal sectional view of the board shown in FIG. 4.

In the illustrated embodiment, for the purpose of using the electric contact elements 400 in the uppermost row in FIG. 2 for grounding or earthing, they are electrically connected through the through-holes 310 to metal conductors 600 provided on the whole rear surface of the board 300 for grounding as shown in FIG. 3. While the metal conductors 600 are arranged all over the rear surface of the board 300, they may be partly provided in a patterned shape. Alternatively, in practice, metal layers such as copper foils may be attached to the board 300, or a copper foil may be treated by the use of the printed circuit forming method to provide the metal conductors 600.

Moreover, the board 300 is formed with inverted U-shaped slits 320 closely around the electric contact elements 400 in a simple manner by press-punching, laser machining, or the like. Because of the particular shape of the slits 320, the electric contact elements 400 are elastically supported by small tongue-shaped movable pieces 330 located inside the respective slits 320.

Preferably, the protection covering layer 500 is provided all over the board 300 with exception of the portions corresponding to the slits 320 and openings 510 on the side of the first connector plate 100 as shown in FIG. 1. The protection covering layer 500 may be formed in a simple manner by the printed circuit forming method. The openings 510 are preferably filled with solder by the flow plating method or the like to provide metal layers 700 jointed to the electric contacts 400, although the openings 510 may be left as spaces. By filling the opening 510 with the solder the electric contact elements 400 are reinforced to provide the robust connector superior in durability.

With this construction, as the electric contact elements 400 according to the invention have the elasticity, when the second connector plate 200 is brought into abutment against the first connector plate 100 so that the electric contact elements 400 abut against the electric contacts 111 of the hemispherical protrusions on the first connector plate 100, the electric contact elements 400 capable of following the electric contacts 111 will elastically contact them to keep the stable electrical connection therebetween even if there are some differences of the elastic contacts 111 in height.

In this manner, the electrical connection is accomplished with high reliability. As the elasticity for the electric contact elements 400 depends on the elasticity of the small tongue-shaped movable pieces 330 of the board 300, it is required for the board 300 of the hard resin to have a rigidity to an extent such that a sufficient elasticity is given to the small tongue-shaped movable pieces 330.

With the arrangement of the electric contact elements 400 according to the invention, the electric contact elements 400 in the uppermost row other than those in the intermediate and lower rows are electrically connected to the metal conductors 600 on the opposite side of the board 300 for grounding or earthing. In this case, the impedance therebetween can be easily set at a value of the order of 50Ω by applying the microstrip line design. In other words, the impedance can be easily adjusted according to the invention.

Figure 6:
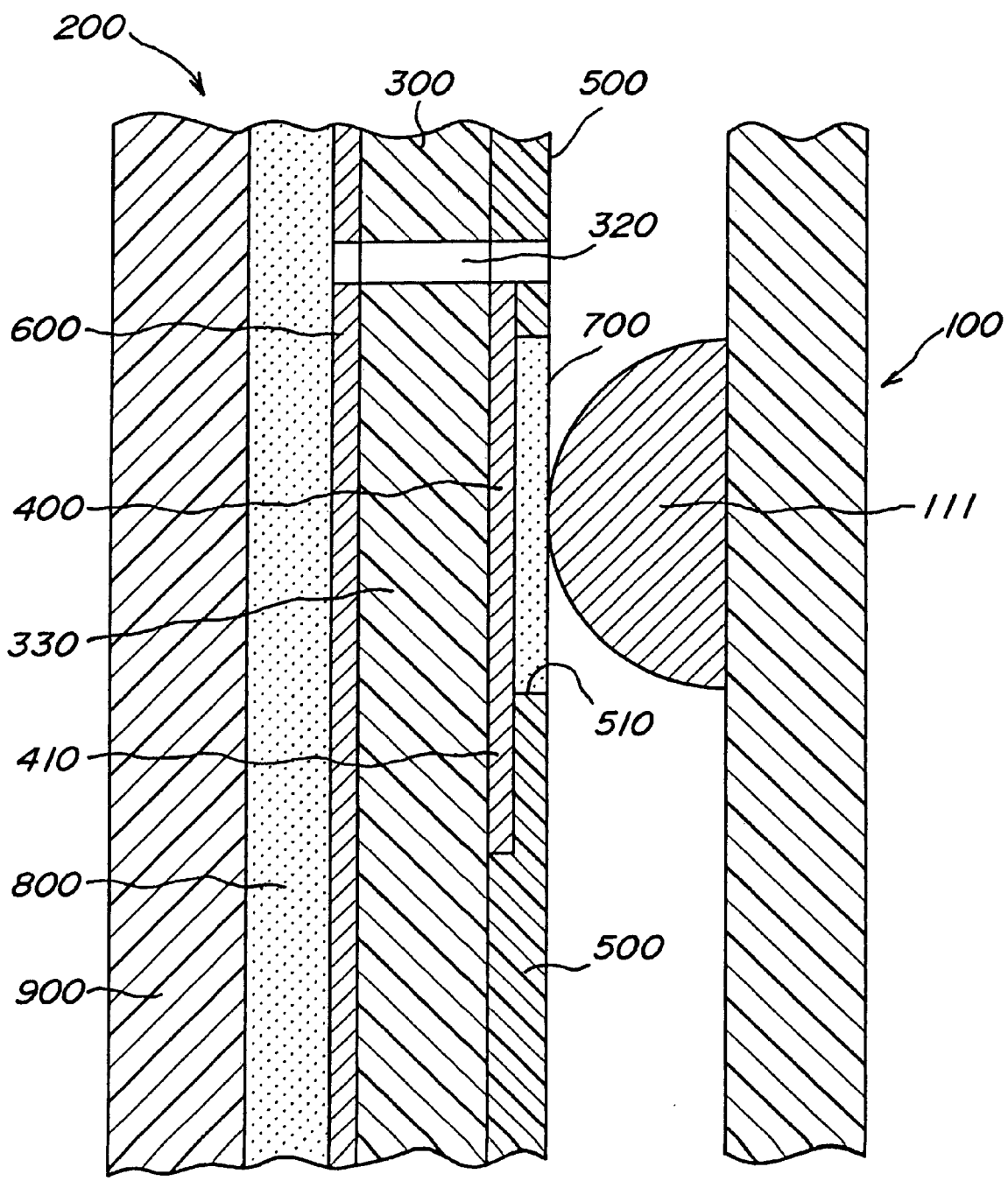
FIG. 6 is a partially enlarged longitudinal sectional view of another embodiment of the electrical connector according to the invention.

FIG. 6 illustrates the electrical connector according to another embodiment of the invention. The electrical connector shown in FIG. 6 is substantially identical with the electrical connector shown in FIGS. 1 to 5, with the exception of a second connector plate 200 including a flexible printed board 300 on which electric contact elements 400 are formed, an elastomer layer 800 of an elastomer resin having a high elasticity on the opposite side of the electric contact elements 400, and a back-up plate 900 having a rigidity for supporting the elastomer layer 800. The material from which the elastomer layer 800 is made is not limited to the elastomer resin having the elasticity, and may be a metallic spring material or a composite material of an elastomer resin and a metallic spring material.

With this construction, the elasticity of the electric contact elements 400 is achieved by the good elasticity of the board itself made of a flexible printed board in conjunction with the elasticity of the elastomer layer 800 of the elastomer resin having the high elasticity to provide a more pliably delicate contact with the electric contacts 111 of the first connector plate 100, thereby enabling the electric contacts 111 and electric contact elements 400 of the first and second connector plates 100 and 200 to contact each other in significantly good condition.

With the above construction of the electrical connector, it is needed to maintain the elasticity stably at the electric contact elements in order to cope with repeated connections and disconnections of great many times. In view of this, it has been found that the board on which electric contact elements are formed is preferably as thinner as possible.

On the other hand, there are often the cases requiring impedance characteristics (for example, impedance value of the order of 50Ω) by applying the microstrip line design between lead lines composed of metal layers of electric contacts and metal conductors on the opposite side of the board for grounding, depending upon of applications of electrical connectors. In such cases, in order to cope with repeated connections and disconnections of first and second connectors, the board is needed to be thinner to maintain the elasticity stably at the electric contact elements.

However, when the board becomes thinner, the width of lead lines must be narrower. With too narrow width of the lead lines, transmission losses of signals would tend to occur. In other words, in the design of the microstrip line, the thickness of a board (elasticity in the proximity of electric contacts) and the width of lead lines (transmission losses of signals) are incompatible with each other.

Figure 7:
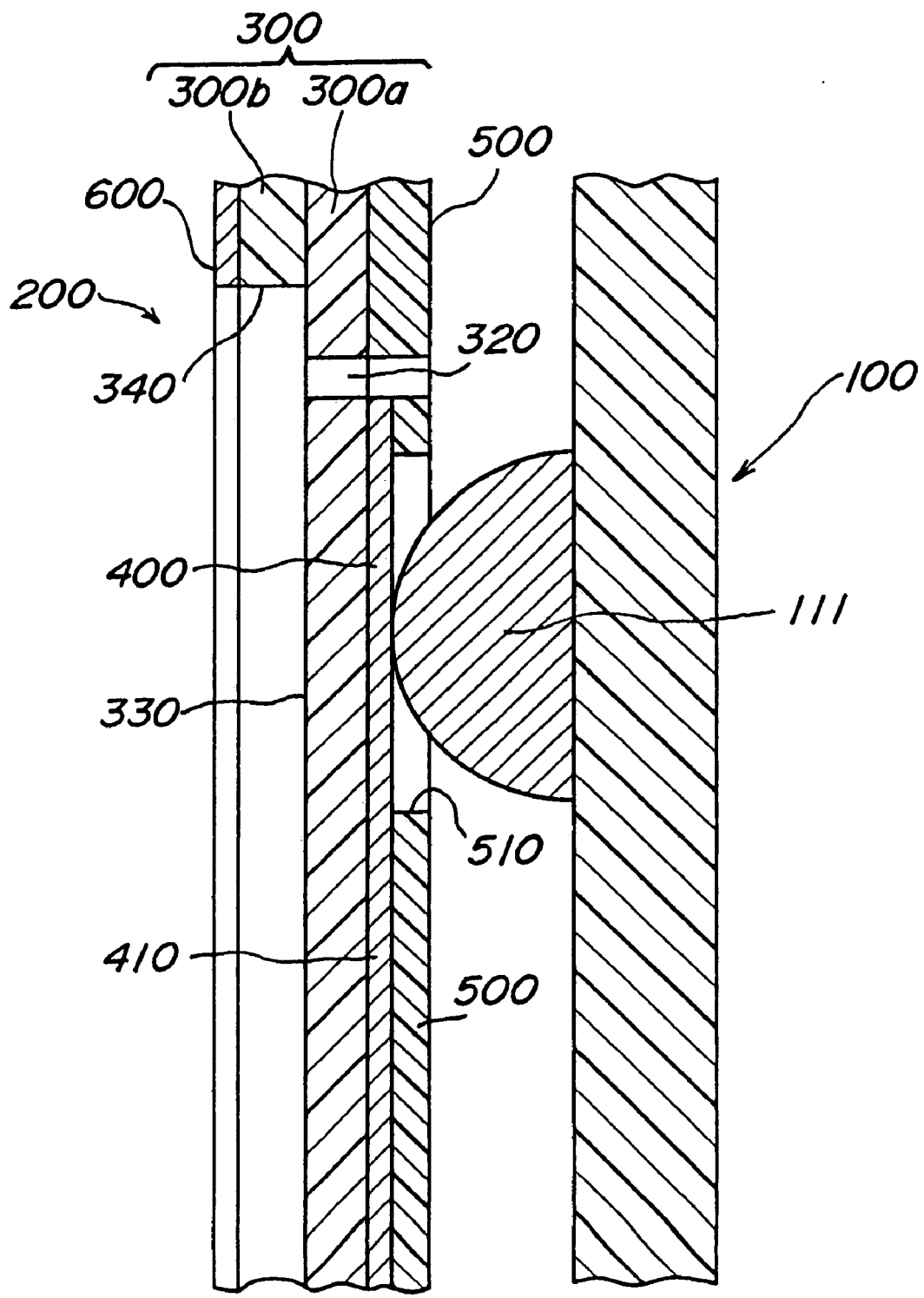
FIG. 7 is a partially enlarged longitudinal sectional view of a further embodiment of the electrical connector according to the invention.
Figure 8:
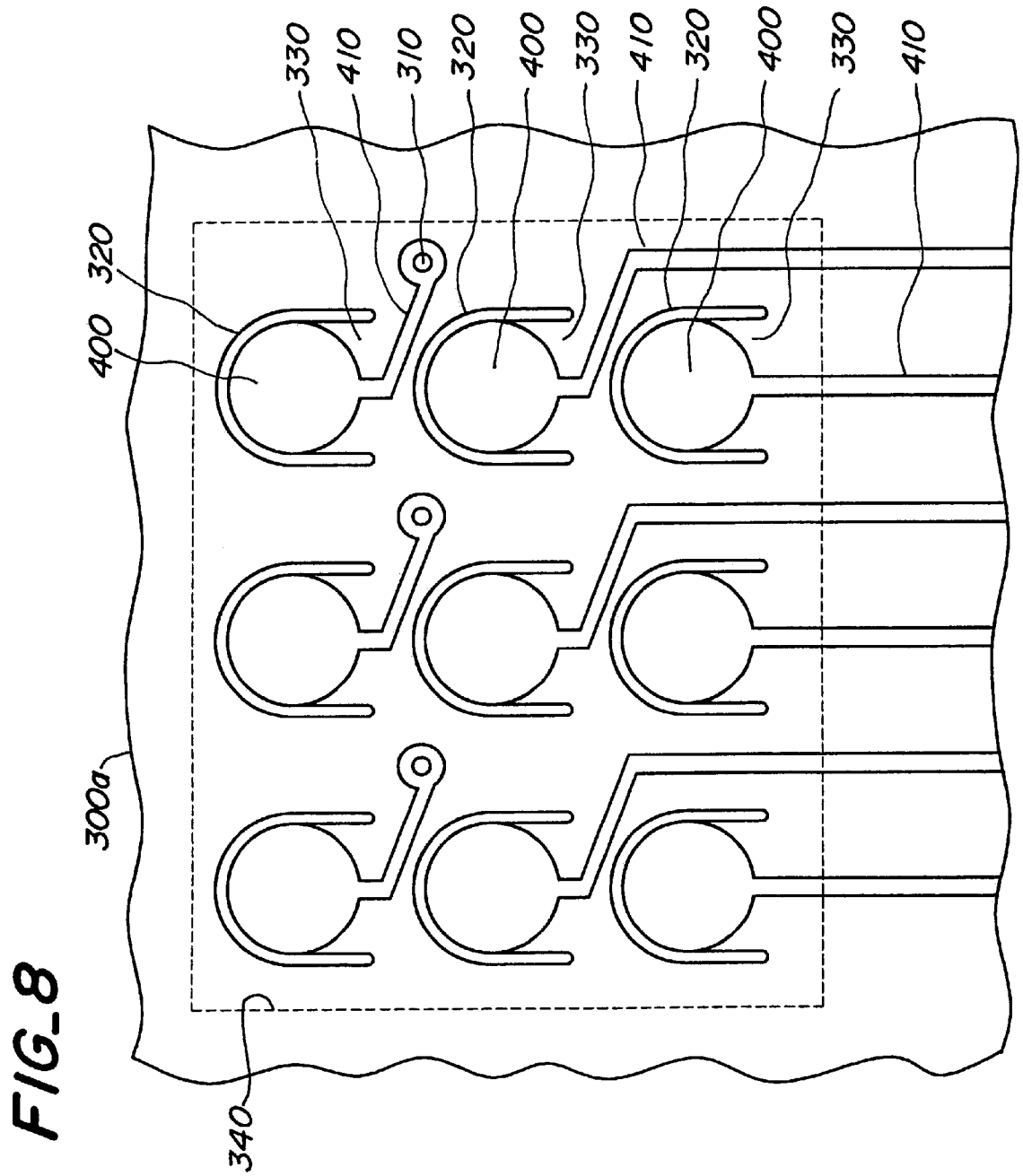
FIG. 8 is a partially enlarged plan view of the board of the second connector of the electrical connector shown in FIG. 7.
Figure 9:
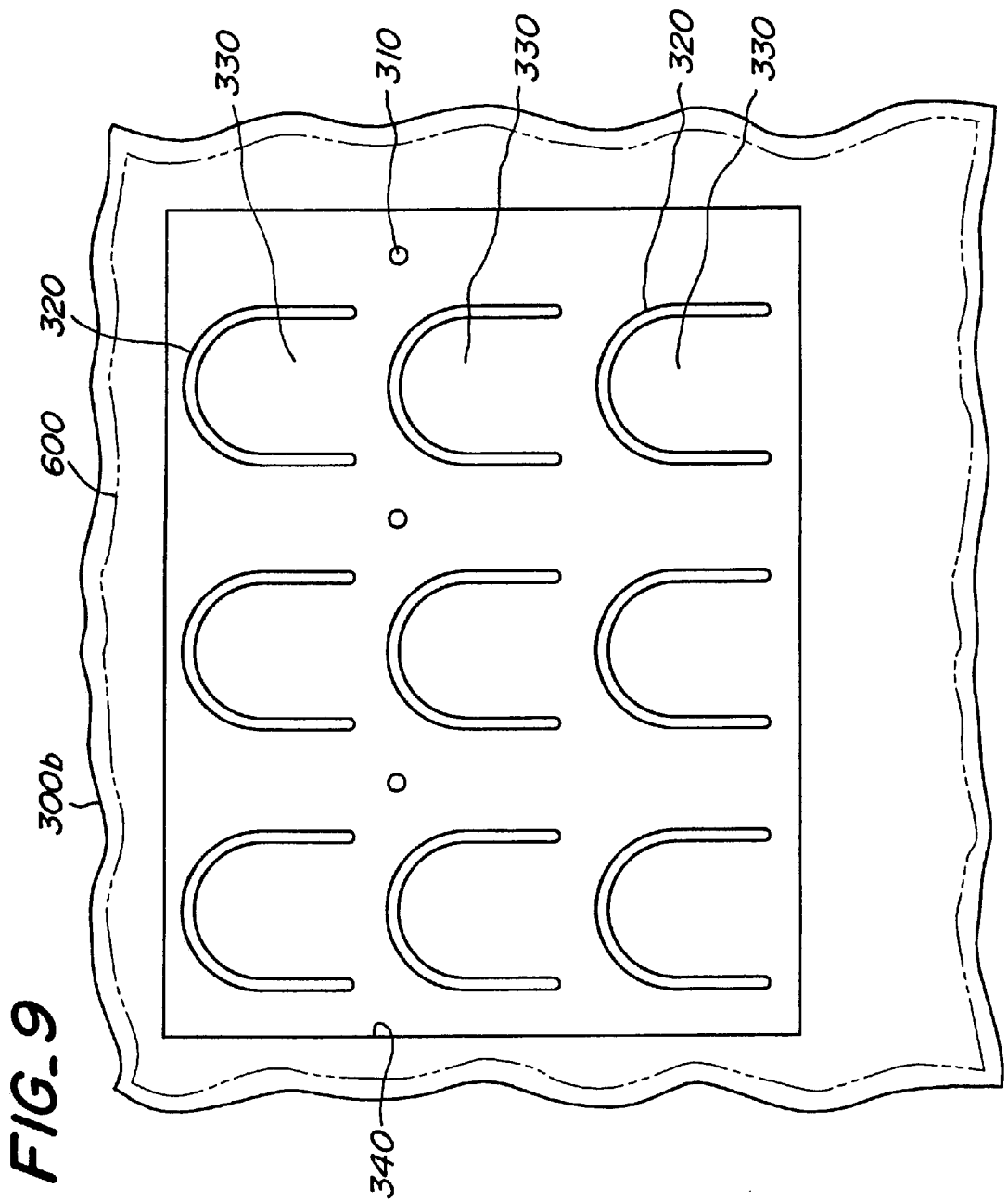
FIG. 9 is a partially enlarged plan view of the board shown in FIG. 7 viewing on the rear side thereof.

In order to eliminate the incompatible relation therebetween, we propose the following embodiment which will be explained hereinafter. FIGS. 7 to 9 illustrate the electrical connector of such an embodiment which comprises a first connector plate 100 made of a ceramic or hard resin substrate or board having a rigidity including a plurality of electric contacts 111 of hemispherical protrusions of solder or the like provided on one surface of the first connector plate 100, and a second connector plate 200 consisting of a substrate or board 300 made of for example two laminated hard resin plates (for example polyimide resin plates or other insulating thin plates) 300a and 300b having a suitable rigidity. The second connector plate 200 is provided with a plurality of electric contact elements 400 made of disc-shaped metal layers on one surface of the second connector plate 200, a protection covering layer 500 of an insulating material provided on the side of the electric contact elements 400, and metal conductors 600 provided on the opposite side of the electric contact elements 400 for grounding or earthing.

The electrical connector shown in FIGS. 7 to 9 is substantially similar to the electrical connector shown in FIGS. 1 to 5. In this embodiment, the required electric contact elements 400 are provided on one surface of the hard resin plate 300a for example by treating a metal layer such as a copper foil previously provided thereon by means of the printed circuit forming method as shown in FIG. 8.

In the same manner as in FIGS. 1–5, the hard resin plate 300a which is one of members composing the board 300 is formed with inverted U-shaped slits 320 closely around the electric contact elements 400 in a simple manner by press-punching, laser machining, or the like. As a result, the electric contacts 400 are elastically supported as in FIGS. 1–5. Moreover, the protection covering layer 500 and the openings 510 will not be described in further detail since these are substantially the same as those in FIGS. 1 to 5.

As can be seen in FIG. 11, the hard resin plate 300b which is the other of members composing the board 300 is formed with a relatively large opening 340 by removing the region of the hard resin plate 300b corresponding to the region of the hard resin plate 300a including all the electric contact elements 400. Therefore, even if the overall thickness of the board 300 consisting of the hard resin plates 300a and 300b is thicker, the electric contact elements 400 are sufficiently elastically supported because only the movable small pieces 330 of the hard resin plate 300a participate in supporting the electric contact elements 400. Moreover, by providing the relatively large opening 340 of the hard resin plate 300b, it makes easy to position the plate 300b relative to the electric contact elements 400 on the plate 300a without requiring particularly high accuracy and makes it easy to form the opening 340 by machining.

Similarly to the electrical connector shown in FIGS. 1–5, with the electrical connector of the illustrated embodiment, the electrical connection is accomplished with high reliability, and the impedance can be easily adjusted. In addition, it is possible to limit the transmission losses at the lead wires 410 to a minimum value. This is because the too thin lead wires 410 will increase the transmission losses to make it impossible to transmit electric signals, inasmuch as the electric contact elements in the intermediate and lower rows are connected to the lead wires 410 which extend to the end of the hard resin plate and are soldered thereat.

Namely, it has been found as a result of the inventor's investigation that there is a relation between the thickness (h) of the board 300 and the thickness (t) and width (w) of the lead wire 410 (FIG. 12) as mentioned in Table 1 in order to obtain the impedance Z0 of the order of 50Ω, and the thickness (h) of the board 300 must be thicker in order to limit the transmission losses to a minimum value by making wider the width (w) of the lead wire 410. However, when the thickness (h) of the board 300 becomes thicker, the elasticity of the small tongue-shaped movable pieces 330 supporting the electric contact elements 400 decreases. The hard resin plates composing the board are polyimide resin plates whose dielectric constant is denoted by $\epsilon$ in the Table 1.

TABLE 1

| Sample No. | 1 | 2 | 3 |
|---|---|---|---|
| Thickness of Board (h) | 25 μm | 100 μm | 150 μm |
| Thickness of Lead Wire (t) | 23 μm | 23 μm | 23 μm |
| Width of Lead Wire (w) | 44 μm | 205 μm | 315 μm |
| Dielectric Constant of Board Resin Material ($\epsilon$) | 3.5 | 3.5 | 3.5 |
| Impedance ($Z_0$) | 50.4 Ω | 50.3 Ω | 50.3 Ω |

According to the invention the board 300 consists of the two hard resin plates 300a and 300b. As can be seen from the Table 1, when the total thickness (h) of the board 300 is of the order of 100 μm or 150 μm, the width (w) of the lead wire 410 can be correspondingly wider to 205 μm or 315 μm, obtaining the good trans mission characteristics. Moreover, the thickness of the hard resin plate 300a formed with the small tongue-shaped movable pieces 330 supporting the electric contact elements 400 is of the order of 25 μm so that the high elasticity for supporting the electric contact elements 400 can be obtained. If the total thickness of the board 300 is of the order of 25 μm for obtaining the high elasticity, the width (w) of the lead wire 410 becomes only 44 μm which may provide the impedance of the order of 50Ω but would involve a risk of transmission losses.

As can be seen in FIG. 15, on the other hand, the hard resin plate 300b which is one of members composing the board 300 is formed with the openings 340 which are formed by removing tongue-shaped portions corresponding to the slits 320 of the hard resin plate 300a. Therefore, even if the total thickness of the board 300 (the hard resin plates 300a and 300b) is thicker, the small tongue-shaped movable pieces 330 supporting the electric contact elements 400 have the sufficient elasticity because they are parts of only one plate 300a.

FIGS. 13 to 15 illustrate the electrical connector according to the embodiment of the invention, which is substantially similar to that shown in FIGS. 7 to 11, with exception of the openings 340 of a hard resin plate 300b which is one of members composing the board 300. In more detail, the openings 340 are formed by removing those of the hard resin plate 300b which correspond to the small tongue-shaped movable pieces 330 surrounded by the slits 320 of the hard resin plate 300a as shown in FIG. 14 or 15.

Although the hard resin plate 300b is formed with a number of openings 340 positionally corresponding to the slits 320 of the hard resin plate 300a so that the formation of the openings 340 requires a somewhat difficult machining. However, the openings 340 are allowed to be larger to some extent than the areas corresponding to the tongue-shaped movable pieces 330 surrounded by the slits 320, so that any high accuracy in positioning the openings 340 in the hard resin plate 300b is not needed. Advantageously, both the hard resin plates 300a and 300b are jointed with each other except the small tongue-shaped movable pieces 330, so that the board 300 consisting of the jointed plates 300a and 300b increases its strength and durability. In other words, the resin plates can be thinner to obtain the same strength of the board 300.

While the two hard resin plates 300a and 300b are used in order to make thinner the small tongue-shaped movable pieces 330 supporting the electric contact elements 400, the openings 340 may be provided by partially removing the rear side of one hard resin plate. The two hard resin plates 300a and 300b may be jointed with each other by an adhesive.

Figure 16:
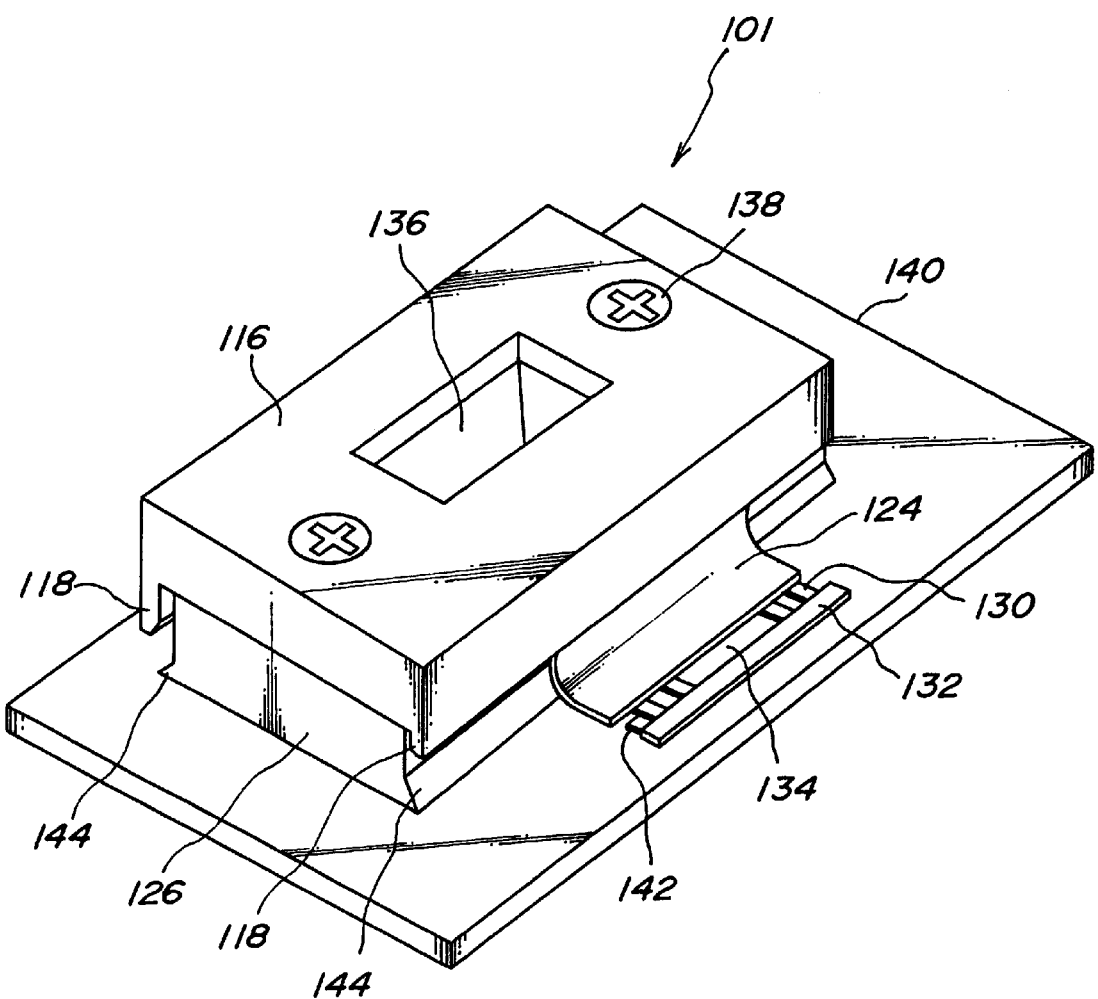
FIG. 16 is a perspective view of a further embodiment of the electrical connector and a board according to the invention.

A plug and socket mechanism according to the invention will be explained hereinafter. FIG. 16 illustrates in a perspective view the electrical connector 101 according to the invention and a substrate or board 140. FIG. 17A illustrates the electrical connector 101 in FIG. 16 in a longitudinal cross-section taken along its longitudinal center line. FIG. 17B illustrates another electrical connector 101 according to the invention in longitudinal cross-section.

Referring to FIG. 17A, a first connector 110 comprises a ceramic or hard resin substrate or board 114 having a rigidity, and a plurality of electric contacts 112 of hemispherical protrusions made of solder or the like provided on one surface of the hard resin board 114. A second connector 120 comprises a FPC board (flexible printed card board) 124 made of polyimide or the like having suitable flexibility, and electric contact elements 122 made of disc-shaped metal layers 130 provided on one surface of the FPC board 124. The electrical connector 101 mainly comprises the first connector 110, the second connector 120, a housing 116, a block 126, a bit-insert 154 and bolts 138.

Figure 19A:
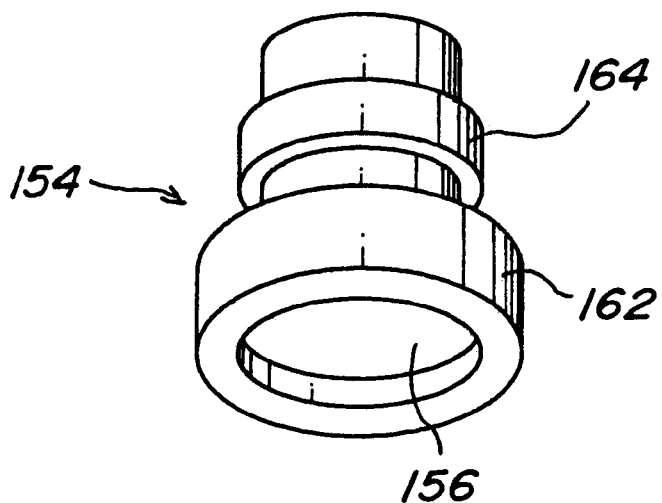
FIG. 19A is a perspective view of the bit-insert to be used in the present invention.
Figure 19B:
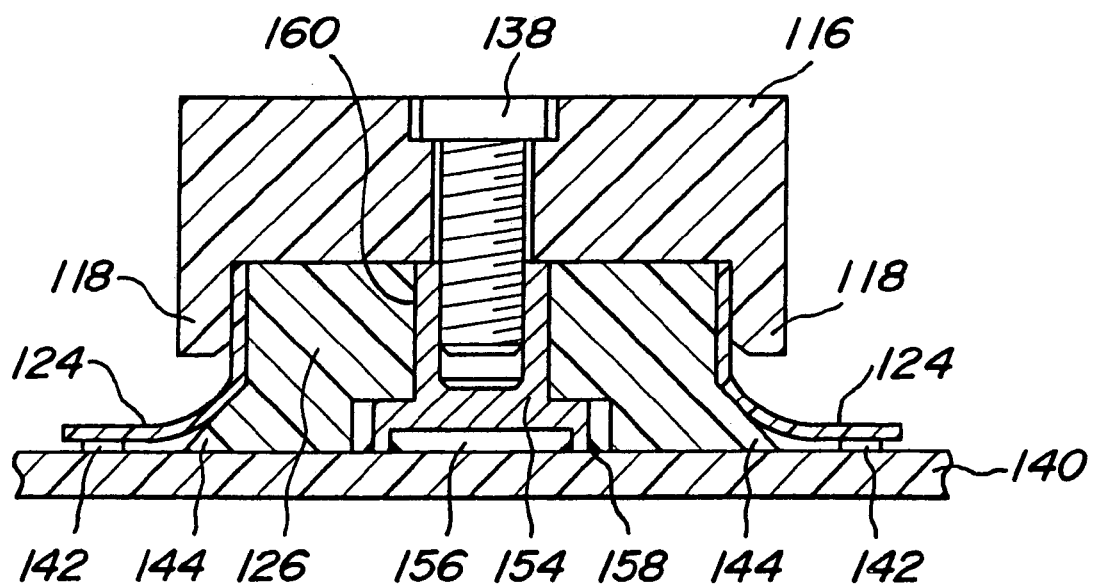
FIG. 19B is a sectional view of the electrical connector shown in FIG. 16 taken along its bolt.

First, the housing 116 will be explained. As shown in FIG. 16, the housing 116 is formed with a fitting opening 136 passing through the housing in its thickness direction for receiving therein the first connector 110. The housing 116 is further formed with apertures longitudinally aligned with the fitting opening 136 (FIG. 16) for receiving therein the bolts 138 for fixing the block 126 and the housing 116 to each other as shown in FIG. 19B.

Moreover, the housing 116 is provided with projections 118 at the ends in its width direction on which sides the ends of the FPC board 124 of the second connector 120 extend (FIGS. 17A and 17B). The projections 118 serve to urge the FPC board 124 toward pads 142 of the board 140. The projections 118 may have any shape so long as they can urge the FPC board 124 toward the pads 142 of the board 140. Preferably, portions of the projections 118 adapted to contact the FPC board 124 are chamfered to be rounded in section thereat to prevent the FPC board 124 from being impaired by the projections 118. The size of the projections 118 may be suitably designed in consideration of the strength and workability of the housing 116.

A modified housing 116 urging the FPC board 124 of the second connector 120 will be explained with reference to FIG. 17B. With the housing 116 shown in FIG. 17A, it is required to secure the FPC board 124 to the pads 142 of the board 140 by soldering after the FPC board 124 has been urged toward the pads 142. The modified housing 116 enables the soldering to be eliminated. The modified housing 116 in this embodiment shown in FIG. 17B is provided with urging members 146 in the projections 118 at locations corresponding to the pads 142 of the board 140, so that the metal layers 130 of the FPC board 124 are connected to the pads 142 of the board 140 only forcing the FPC board 124 against the pads 142 by the urging members 146 without requiring soldering.

Materials from which the urging members are made may be any materials so long as they can urge the FPC board 124. In order to avoid repairing of the FPC board 124, the materials for the urging members are preferably elastic materials such as elastomers. The urging members 146 may be fixed to the projections 118 by press-fitting, an adhesive or the like.

The housings 116 shown in FIGS. 17A and 17B are made of an electrically insulating plastic material by the known injection molding. The materials from which the housings are made are polybutylene terephthalate (PBT), polyamide (PA), liquid crystal polymer (LCP), polyphenylene sulfide (PPS) and the like.

Then, the block 126 will be explained herein. As shown in FIGS. 19A and 19B, the block 126 is formed with insert apertures 160 for inserting bit-inserts 154 thereinto at the locations corresponding to the apertures for the bolts 138. The bit-inserts 154 are secured in the insert apertures 160 by press-fitting or an adhesive.

The block 126 is further provided with a recess at a location corresponding to the fitting opening 136, which is somewhat larger than the fitting opening 136 and in which an elastic member 128 is arranged as shown in FIGS. 17A and 17B. The elastic member 128 is made of an elastomer to provide the elastic contact between the electric contacts 112 and the electric contact elements 122 in stable condition when the first and second connectors are connected.

Moreover, the block 126 is further provided with tapered portions 144 at the ends in its width direction on which sides the FPC board 124 of the second connector 120 extends as shown in FIGS. 17A and 17B. The tapered portions 144 guide the FPC board 124 toward the pads 142 of the board 140. The tapered portions 144 may have any shape so long as they serve to guide the FPC board 124. The block 126 is made of an electrically insulating plastic material by the known injection molding. The materials from which the block 126 is made are substantially the same as those for the housing 116.

The connection of the board 140 of the second connector 120 to the pads 142 will be explained herein with reference to FIGS. 18A and 18B. In order to confirm the connection of the soldered metal layers 130 to the FPC board 124 of the second connector 120, the insulating layer 132 in the proximity of the connection of the FPC board 124 is partially removed. The removed portion of the insulating layer 132 preferably corresponds to the pads 142 of the board 140 in view of the confirmation of the soldered connection.

The end of the FPC board 124 may be removed so as to expose the metal layers 130 as shown in FIG. 18A, or part of the FPC board 124 may be removed so as to leave the end of the FPC board 124 to expose the metal layers 130 as shown in FIG. 18B. In any case, the soldered connection can be confirmed. In the case shown in FIG. 18A, the metal layers 130 are thinner so that the metal layers 130 tend to move toward the adjacent metal layers 130. Therefore, when the metal layers 130 are arranged with a narrow pitch or in a high density, there is a risk of adjacent metal layers bridging each other during soldering. In view of this, the configuration of the PPC board 124 shown in FIG. 18B is preferable, in which the metal layers 130 are not likely to contact each other.

The bit-insert 154 will be explained with reference to FIGS. 19A and 19B to FIG. 21. In general, the bit-insert 154 comprises two cylindrical portions having different diameters. The smaller diameter cylindrical portion includes a press-fitting portion 164 which is inserted into the insert aperture 160 of the block 126. The bit-insert 154 has a flange or a larger diameter cylindrical portion 162 provided in its bottom with a recess 156 as shown in FIG. 19A for releasing the air during soldering and for increasing solder fillets. The size of the recess 156 is suitably designed in consideration of the strength of the flange 162.

The recess 156 may have any shape so long as it can perform its function. It may be circular as shown at 156 in FIG. 19A, or double circular at 561, straight at 562, or cross at 563 shown in FIGS. 20A, 20B or 20C. Increasing the number of the recesses in FIG. 20A, triple or more recesses may be provided. By providing the recess or recesses 156 in the flange 162 of the bit-insert 154, the solder fillet 158 will be formed in the recess 156 as shown in FIG. 19B to increase the strength of the soldered portion.

As shown in FIG. 21, moreover, the bit-insert 154 is provided with a positioning pin 163 at the center of the bottom of the flange 162 for positioning the board 140. The size of the positioning pin 163 is suitably designed in consideration of its strength and the available space on the board 140. While the positioning pin 163 is formed integral with the bit-insert 154 in the shown embodiment, a separate pin member 163 may be fixed to the bit-insert 154 by press-fitting. On the other hand, the board 140 is formed with a fitting aperture 141 at a location corresponding to the positioning pin 163 of the bit-insert 154. Although the fitting aperture 141 is a through-aperture, it may be a bottomed aperture.

FIGS. 22A and 22B to FIG. 25 illustrate the electrical connector of a further embodiment of the invention. In the drawings, a first connector 210 comprises a ceramic or hard resin substrate or board 214 having a rigidity, and a plurality of electric contacts 212 of hemispherical protrusions of solder or the like provided on one surface of the hard resin board 214. A second connector 220 comprises a hard resin substrate or board 224 having a suitable rigidity, electric contact elements 222 made of disc-shaped metal layers provided on one surface of the board 224 and a protection covering layer 228 made of an insulating material provided on the board 224 on the side of the electric contact elements 222.

The second connector 220 which is one of them important features of the embodiment will be explained herein. The required electric contact elements 222 are provided on one surface of the board 224 for example by treating a metal layer such as a copper foil previously provided thereon by means of the printed circuit forming method which is one of the board producing techniques.

Therefore, a great number of electric contact elements 222 can be produced extremely inexpensively without requiring large space. Lead wires 242 to be connected to the electric contact elements 222 are also of course produced by the printed circuit forming method (FIG. 25). In case of lack of space owing to the electric contact elements 222 arranged in a high density, the lead wires 242 may be formed on the rear surface of the board 224 so as to communicate with through-holes 240 provided at appropriate locations in the board 224.

Moreover, the board 224 is formed with substantially U-shaped slits 230 closely around the electric contact elements 222 as in the previous embodiments of the invention. These slits 230 can be formed in simple manner by punching, laser machining, or the like. Because of the such a particular shape of the slits 230, the electric contact elements 222 are elastically supported by small tongue-shaped movable pieces 238 located inside the respective slits 230.

The protection covering layer 228 is preferably provided all over the board 224 with exception of openings 227 corresponding to the upper surface of the electric contact elements 222 and of similar slits corresponding to the slits 230 of the board 224 as shown in FIGS. 22A and 22B. The protection covering layers 228 may be simply provided by the press-punching or laser machining. Although the openings 227 may be left as spaces, the openings 227 are preferably filled with solder by plating or the like to provide metal layers 226 jointed to the electric contact elements 222. By filling the openings 227 with the solder, the electric contact elements 222 are reinforced to provide the robust connector superior in durability.

With this construction, as the electric contact elements 222 have the elasticity, when the first connector 210 is brought into abutment against the second connector 220 so that the electric contacts 212 of the hemispherical protrusions on the first connector 210 abut against the electric contact elements 212, the electric contact elements 222 capable of following the electric contacts 212 will elastically contact them to keep the stable electrical connection therebetween even if there are some difference of the electric contacts 212 in height.

In other words, the electrical connection is achieved with high reliability. In this case, as the elasticity for the electric contacts 222 depends on the elasticity of the small tongue-shaped movable pieces 238 of the board 224, it is required for the board 224 of the hard resin to have a rigidity to an extent such that a sufficient elasticity is given to the small tongue-shaped movable pieces 238.

Figure 23:
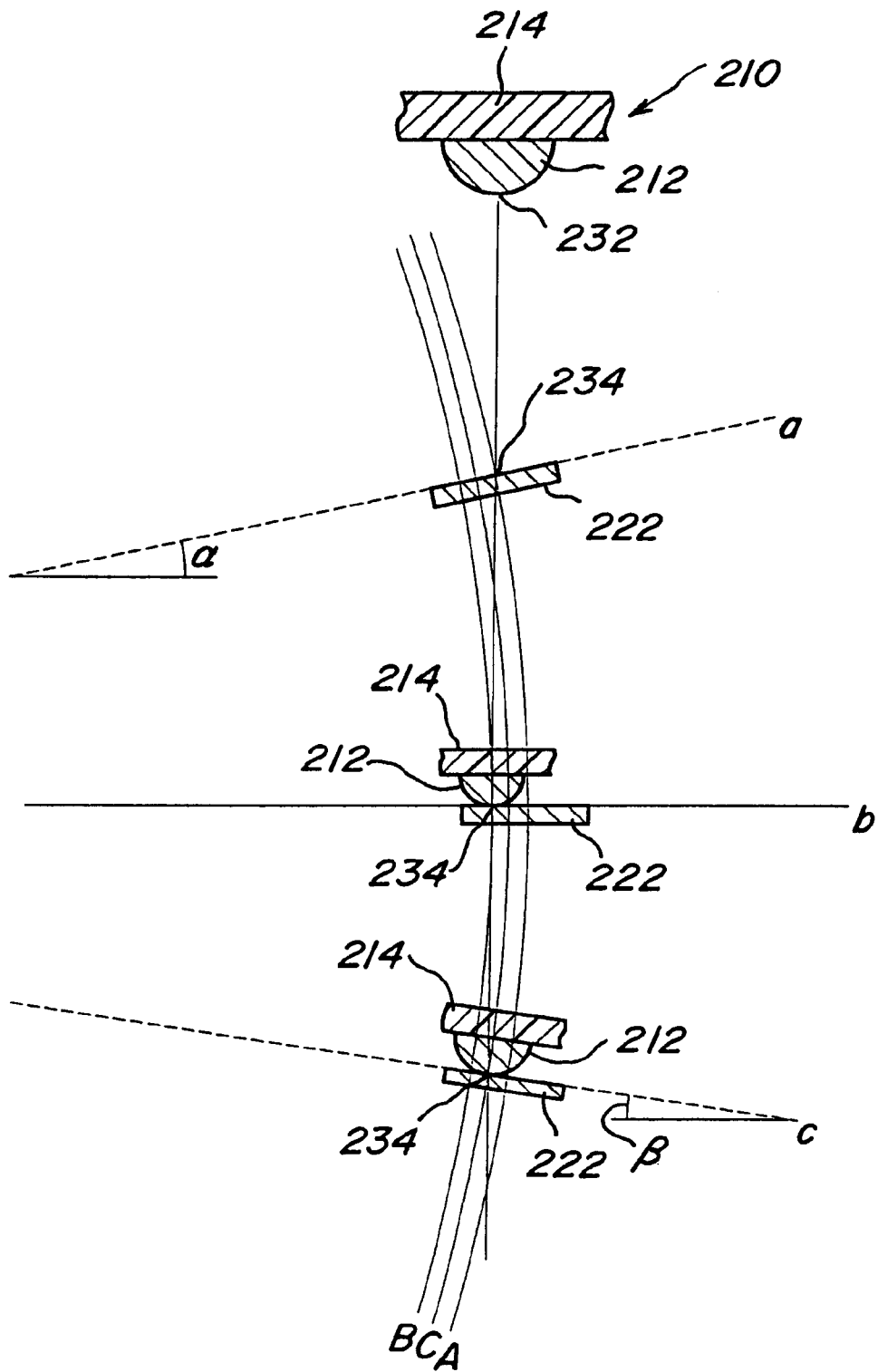
FIG. 23 is a view for explaining movements of the electric contact and the electric contact element shown in FIG. 22A.

As shown in FIGS. 22A and 22B and further FIG. 23, the small tongue-shaped movable pieces 238 supporting the electric contact elements 222 are previously inclined at an angle α toward the electric contacts 212 of the first connector 210. The inclined angle α is suitably designed in accordance with the strength, workability and the like of the board 224. With the small tongue-shaped movable pieces 238 inclined at an angle α, the electric contacts 212 of the first electrical connector 210 can contact the electric contact elements 222 of the second electrical connector 210 earlier than in conventional electrical connectors.

In order to incline the small tongue-shaped movable pieces 238 at the angle α, the pieces 238 of the board 224 may be bent so as to be raised from the board as shown in FIG. 22A, or other raised parts may be attached to the board 224 on the opposite side of the electric contacts 222 as shown in FIG. 22B. The material for the raised parts are metal plates or elastic members (elastomers). Metals for the raised parts are beryllium copper having an elasticity and stainless steel and phosphor bronze having a springiness.

The movement of the electric contact elements 222 of the second connector 220 will be explained with reference to FIG. 23. First, when the first connector 210 is being lowered, the electric contact 212 of the first connector 210 will contact the electric contact element 222 at its contact point 234 positioned in the position a. When the first connector 210 is further lowered, the electric contact 212 of the first connector 210 will move on the electric contact element 222 toward the left viewed in FIG. 23 maintaining the contact therebetween until the electric contact element 222 assumes the horizontal position b which would correspond to an initial contact position in conventional electrical connectors. When the first connector 210 is further lowered, the electric contact 212 of the first connector 210 will move on the electric contact element 222 toward the right viewed in FIG. 23 maintaining the contact therebetween until the electric contact element 222 assumes the position c (inclined at an angle β). The angle β is on the side opposite to the angle α with respect to the horizontal.

The angle α is within a range of 5° to 45°, preferably 10° to 30°. If the angle α is not less than 45°, the electric contact element 222 does not move smoothly in the vertical direction. If the angle α is not more than 5°, the electric contact 212 slidably moves only a short distance on α the electric contact 222, so that the final contact between two electric contacts 212 and 222 at the location sufficiently spaced apart from accumulation or contamination 236 (FIGS. 24A and 24B) becomes difficult. The angle β may be any angle so long as it is less than α. It is sufficient for β to be 1° to 3° less than α.

Figure 24A:
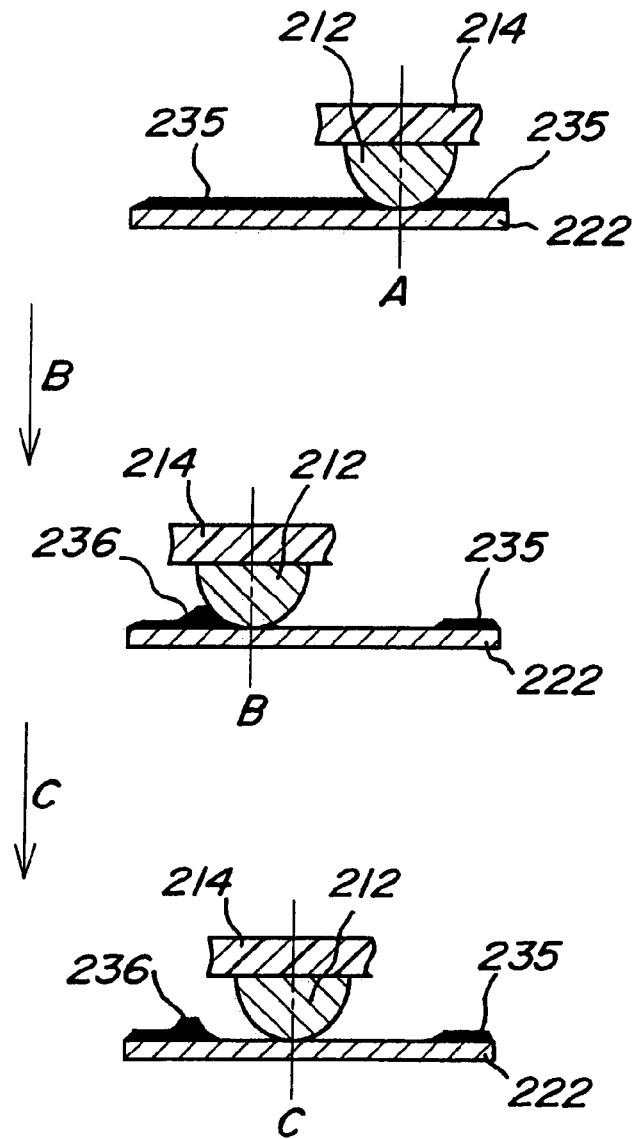
FIG. 24A is a view illustrating the movement of the electric contact shown in FIG. 23 and the accumulation of foreign substances.
Figure 24B:
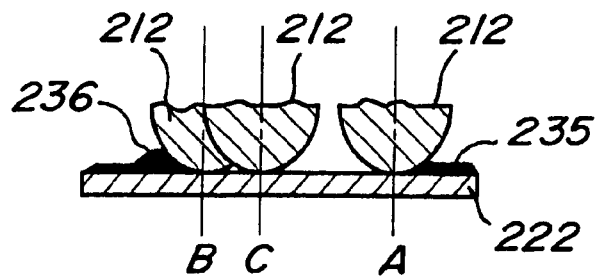
FIG. 24B is a view illustrating the electric contact shown in FIG. 24A in two different positions shown in one drawing.
Figure 26:
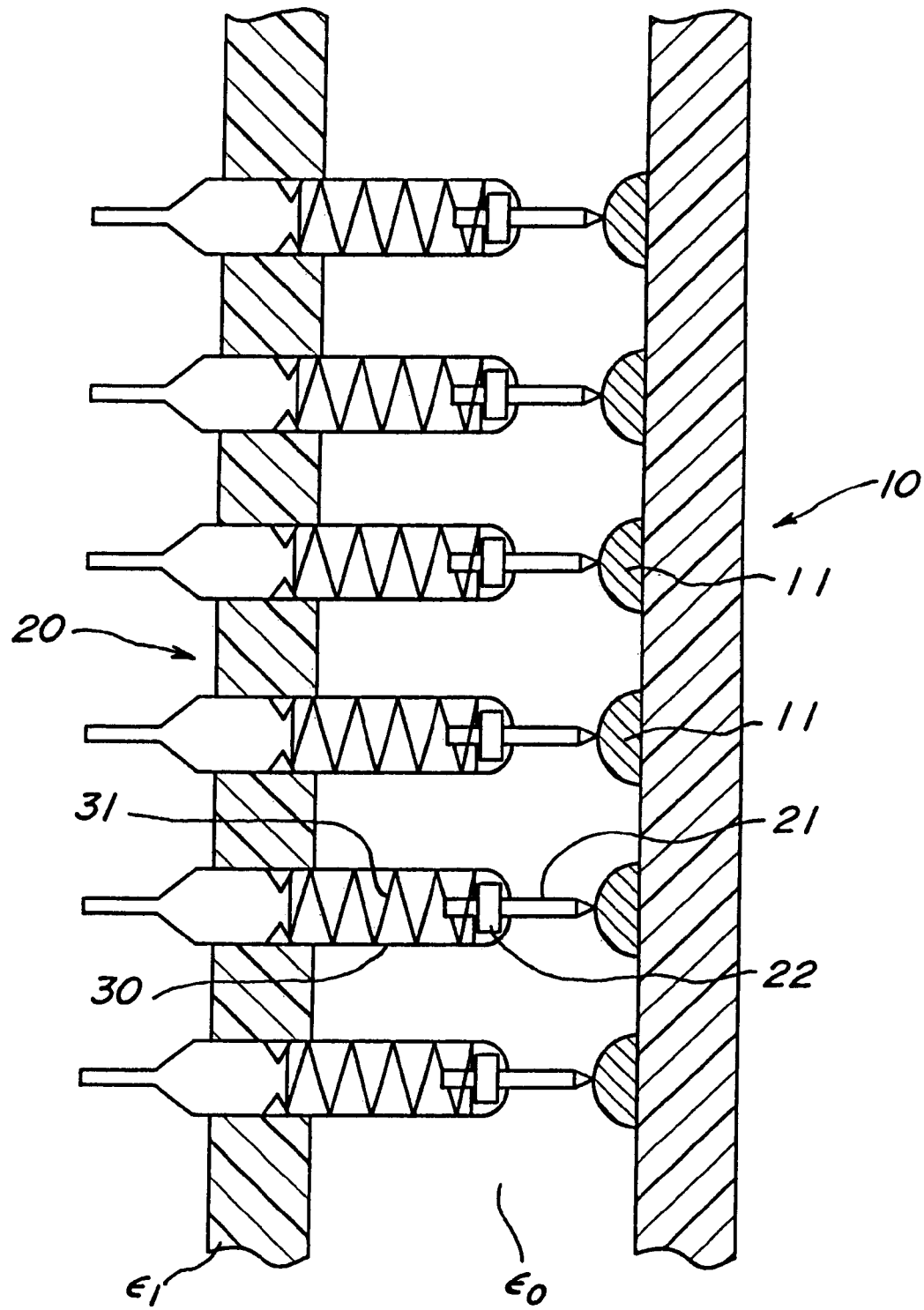
FIG. 26 is a partially enlarged longitudinal sectional view illustrating the electrical connector of the prior art.
Figure 28A:
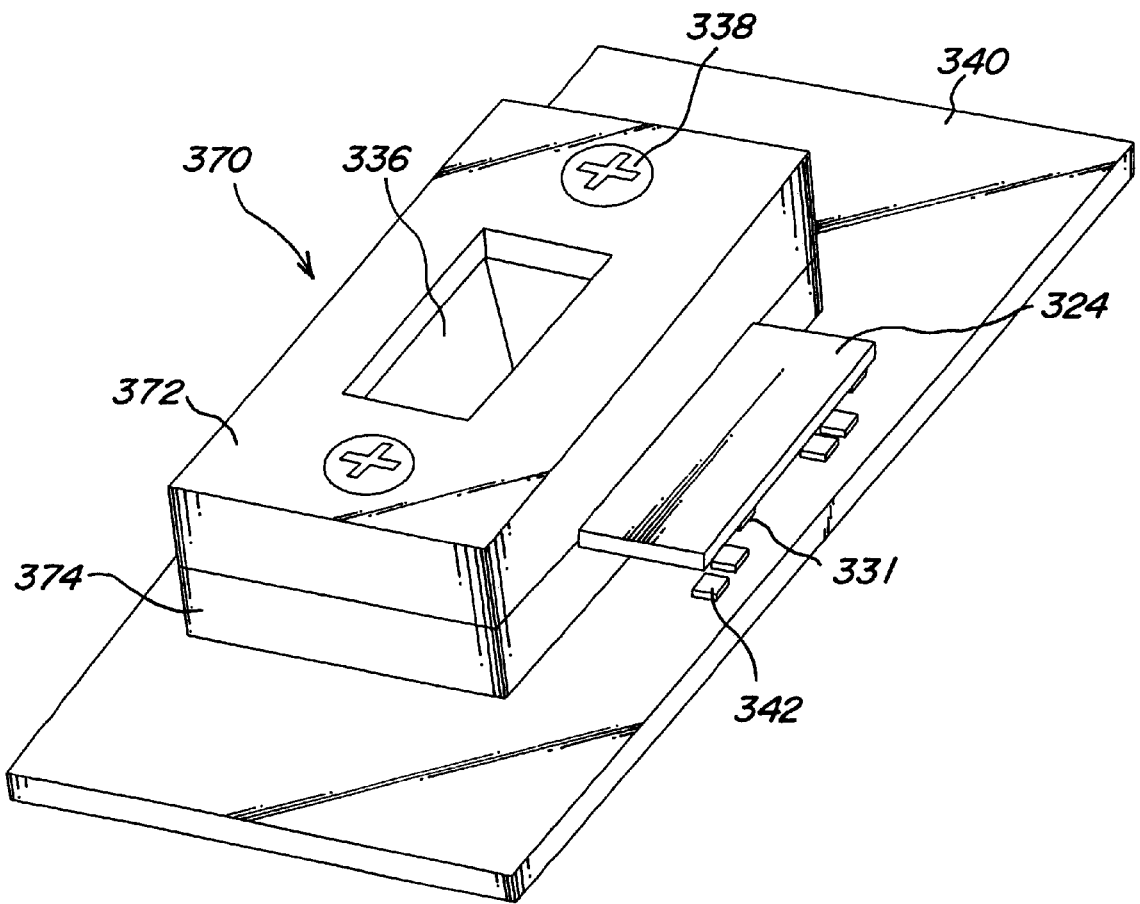
FIG. 28A is a perspective view of another electrical connector of the prior art and its board.
Figure 28B:
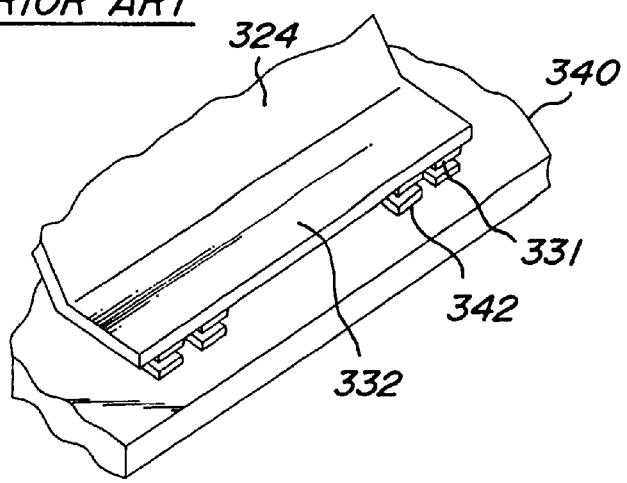
FIG. 28B is a perspective view illustrating the connection with the board of the electrical connector shown in FIG. 28A.
Figure 29:
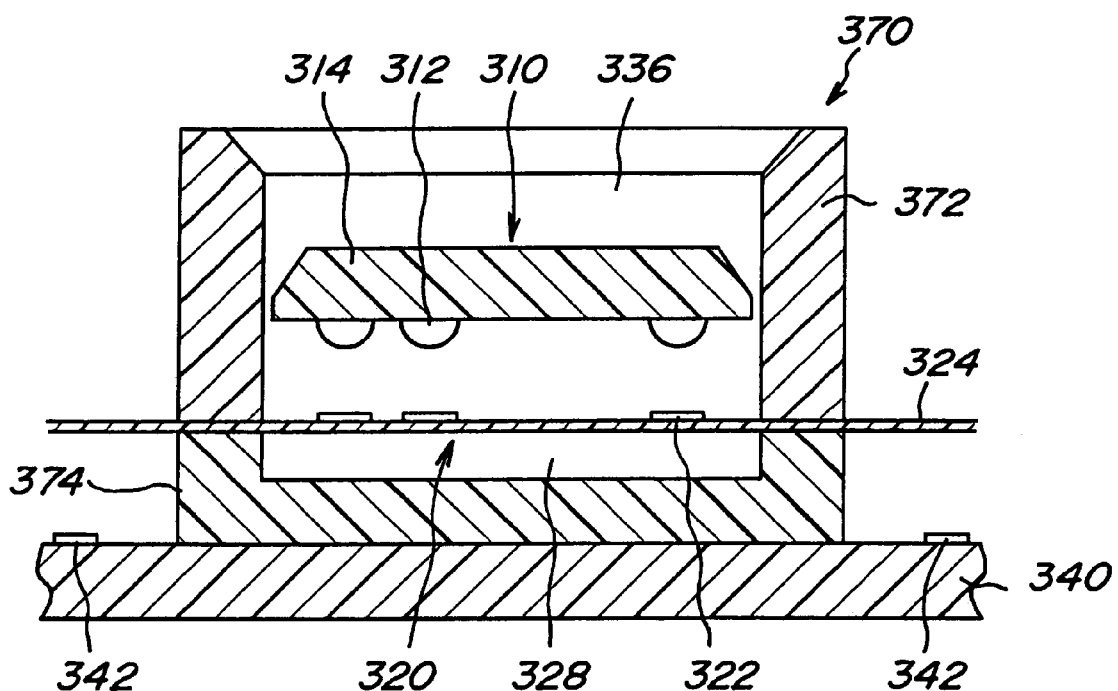
FIG. 29 is a sectional view of the electrical connector shown in FIG. 28A taken along its longitudinal center line.
Figure 30A:
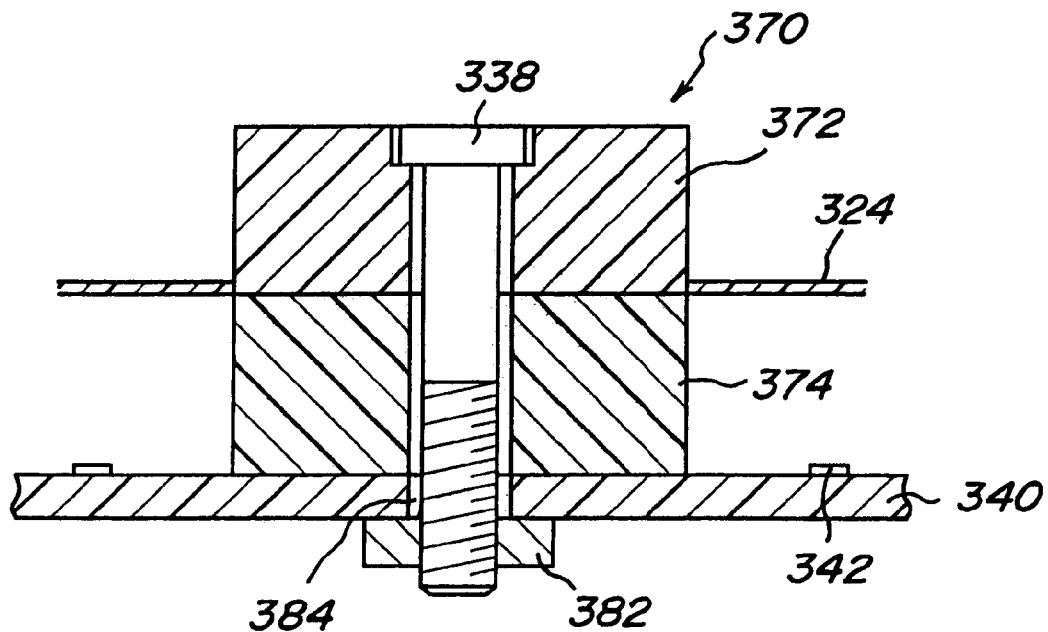
FIG. 30A is a sectional view of the electrical connector of the prior art illustrating the housing, block and board connected by a bolt according to the prior art.
Figure 30B:
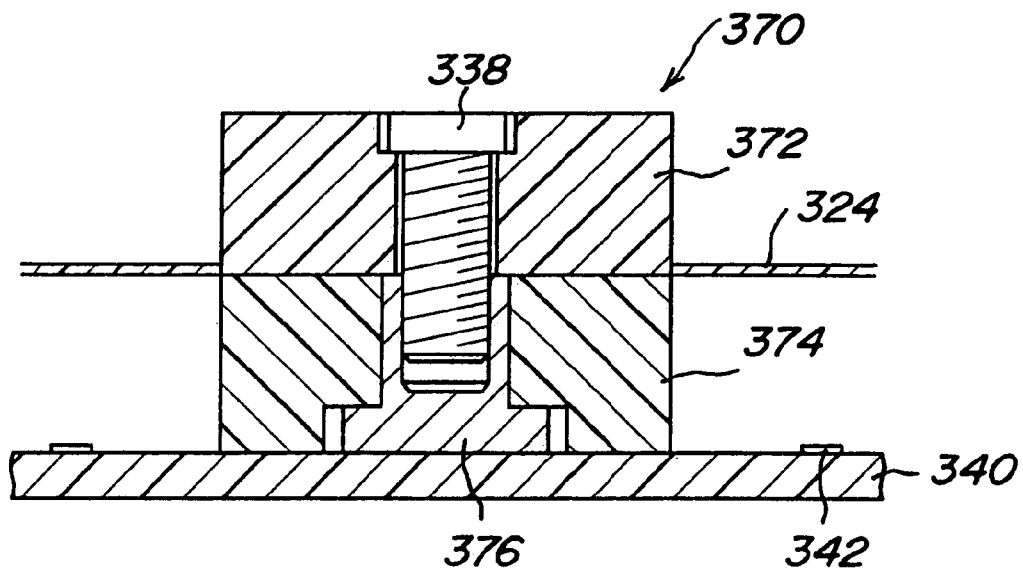
FIG. 30B is a sectional view of the electrical connector of the prior art using a bit-insert instead of the bolt shown in FIG. 30A.
Figure 32:
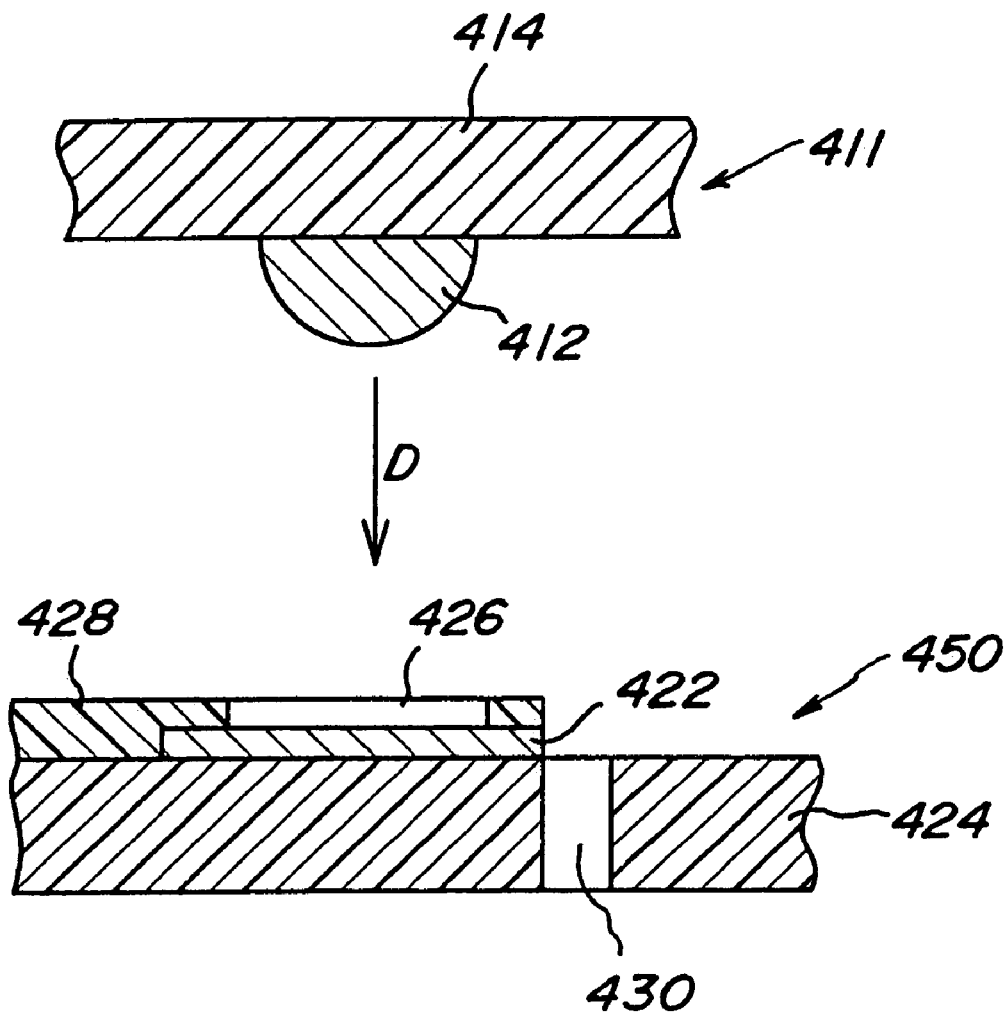
FIG. 32 is a partial sectional view of an electric contact and an electric contact element of an electrical connector of the prior art.
Figure 33A:
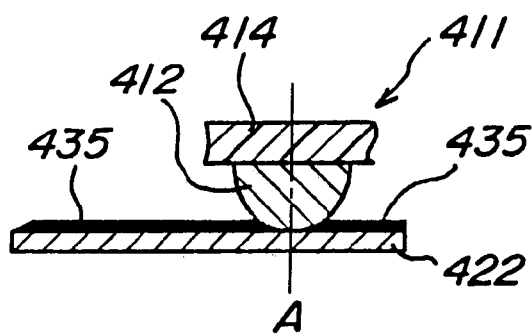
FIG. 33A is a view illustrating movements of the electric contact and the electric contact element shown in FIG. 32.
Figure 33B:
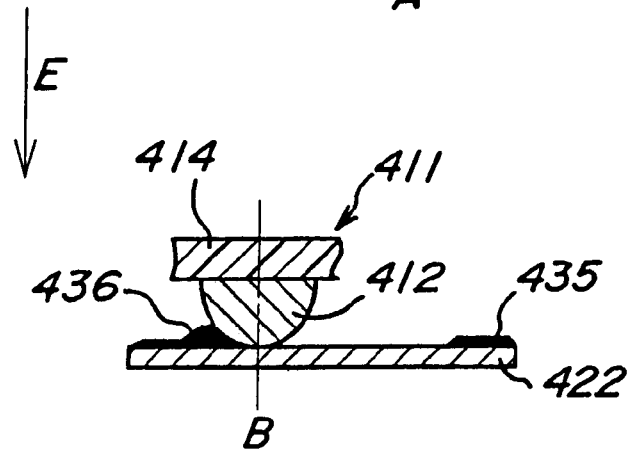
FIG. 33B is a view showing the electric contact shown in FIG. 33A in two different positions shown in one drawing.
Figure 33C:
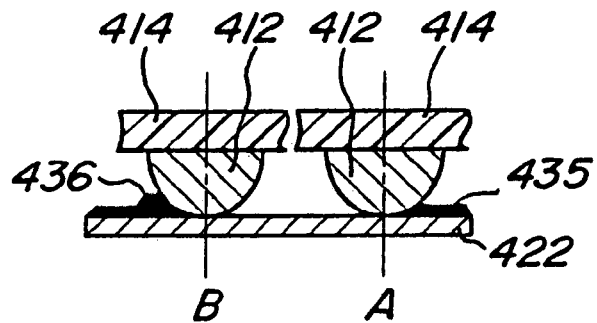
FIG. 33C is a view showing the electric contact shown in FIG. 33A which is riding and rolling over the accumulation of foreign substances on the electric contact element due to the accumulation.

The movement of the elastic contacts 212 will be explained in more detail by referring to FIGS. 24A and 24B. First, the electric contact 212 of the first connector 210 will contact the electric contact element 222 of the second connector 220 at the point A. When the first connector 210 is then lowered in the direction B, the electric contact 212 of the first connector 210 will slidably move on the electric contact element 222 to the point B, while the contamination or foreign substance 236 is wiped or moved by the electric contact 212. When the first connector 210 is further lowered in the direction C, the electric contact 212 of the first connector 210 is returned on the electric contact element 222 to the point C, during which the electric contact 212 moves on that of the electric contact 212 on which there is no contamination or foreign substance because it has been wiped by the electric contact 212 moving from the point A to point B. FIG. 24B illustrates the electric contact 212 respectively occupied the positions A, B and C in one drawing The positions of the electric contacts 212 and 222 are suitably designed in a manner such that the relation α>β is always maintained, that is, the electric contacts 212 of the first connector 210 will remain in a stationarily contacting condition with the electric contact elements 222 at a moment just before the electric contacts 212 of the first connector 210 starts to return toward the first contacting position A.

While the invention has been particularly shown and described with reference to preferred embodiments thereof, it will be understood by those skilled in the art that the foregoing and other changes in form and details can be made therein without departing from the spirit and scope of the invention.

What is claimed is:

1. An electrical connector including a first connector having a plate and a plurality of electric contacts provided on one surface of the plate, a housing having a fitting opening for the first connector, a second connector to be detachably connected to said first connector and having a plurality of electric contact elements provided on one surface of the second connector and a block on which said second connector is mounted, said electric contacts and said electric contact elements of the first and second connectors to be electrically connected to each other, wherein said electric contact elements of the second connector are provided on a board of the second connector, said electric contact elements having metal layers as lead wires having a width (w) greater than 44 μm and not more than 315 μm and extending from said electric contact elements, and said board is formed with slits closely around said electric contact elements thereby enabling the board to support the electric contact elements elastically, wherein said board of the second connector has a thickness (h) not more than 150 μm, and metal conductors are provided on said board of the second connector on the opposite side of its electric contact elements; and wherein said board of the second connector is provided with an elastomeric layer on the opposite side of the electric contact elements.

2. The electrical connector as set forth in claim 1, wherein said electric contact elements of said second connector are provided on said board by the printed circuit forming method.

3. The electrical connector as set forth in claim 1 or 2, wherein metal conductors are provided on the board of said second connector on the opposite side of its electric contact elements and electrically connected to these electric contact elements.

4. The electrical connector as set forth in claim 1, wherein said board of the second electrical connector is a flexible printed card (FPC) board.

5. The electrical connector including a first connector having a plate and a plurality of electric contacts provided on one surface of the plate, a housing having a fitting opening for the first connector, a second connector to be detachably connected to said first connector and having a plurality of electric contact elements provided on one surface of the second connector and a block on which said second connector is mounted, said electric contacts and said electric contact elements of the first and second connectors to be electrically connected to each other, wherein said electric contact elements of the second connector are provided on a board of the second connector, said electric contact elements having metal layers as lead wires having a width (w) greater than 44 μm and not more than 315 μm. and extending from said electric contact elements, and said board is formed with slits closely around said electric contact elements thereby enabling the board to support the electric contact elements elastically, wherein said board of the second connector has a thickness (h) not more than 150 μm, and metal conductors are provided on said board of the second connector on the opposite side of its electric contact elements; and wherein said board of the second connector has a thinner region corresponding to the area including the plurality of the electric contact elements of the second connector to support the electric contact elements elastically.

6. The electrical connector as set forth in claim 1, wherein the portions of the board of the second connector surrounded by said slits are thinner than the other portion of the board.

7. The electrical connector as set forth in claim 1, wherein said electrical connector comprises a plate elastically supporting said electric contact elements by thinner portions of the plate surrounded said slits.

8. An electrical connector including a first connector having a plate and a plurality of electric contacts provided on one surface of the plate, a housing having a fitting opening for the first connector, a second connector to be detachably connected to said first connector and having a plurality of electric contact elements provided on one surface of the second connector and a block on which said second connector is mounted, said electric contacts and said electric contact elements of the first and second connectors to be electrically connected to each other, wherein said electric contact elements of the second connector are provided on a board of the second connector, and said board is formed with slits closely around said electric contact elements, thereby enabling the board to support the electric contact elements elastically, wherein said board of the second electrical connector is a flexible printed card (FPC) board;

wherein said housing is provided on its both sides with projections for urging said flexible printed card board against said board, on which both sides ends of the flexible printed card board extend, and bit-inserts are secured to said block of said second connector as means for causing said housing of the first connector to engage said block.

9. The electrical connector as set forth in claim 8, wherein said block is provided on its both sides with tapered portions for guiding the flexible printed card board on which sides said flexible printed card board extends.

10. The electrical connector as set forth in claim 9, wherein that part of an insulating layer of said flexible printed card board which is urged against pads of a board of said second connector is removed.

11. The electrical connector as set forth in claim 9, wherein that part of an insulating layer of said flexible printed card board which is urged against the pads of a board of said second connector is removed, leaving the other part of the insulating layer located at the end of the flexible printed card board.

12. The electrical connector as set forth in claim 9, wherein said bit-insert is provided with a recess at its bottom for releasing the air and increasing solder fillets.

13. The electrical connector as set forth in claim 12, wherein said bit-insert is provided with a positioning pin at the center of its bottom for positioning said board of the second connector.

14. The electrical connector as set forth in claim 12, wherein said housing is provided with urging members in said projections of the housing for urging the flexible printed card board of the second connector to pads of said board.

15. A contact construction of an electrical connector including a first connector having a plate and a plurality of electric contacts provided on one surface of the plate, a housing having a fitting opening for the first connector, a second connector to be detachably connected to said first connector and having a plurality of electric contact elements provided on one surface of the second connector and a block on which said second connector is mounted, said electric contacts and said electric contact elements of the first and second connectors to be electrically connected to each other, wherein a board supporting said plurality of electric contact elements of the second connector is formed with slits for elastically supporting said electric contact elements, and said electric contact elements of the second connector are arranged such that these electric contact elements are inclined at an angle of α toward the electric contacts of the first connector before the electric contacts and the electric contact elements of the first and second connectors have not contacted, and said electric contact elements of the second connector are inclined at an angle of β on the opposite side of the angle α with a relation of α>β when said first and second connectors have been connected.

16. The contact construction of an electrical connector as set forth in claim 15, wherein said angle of α is within a range of 10° to 30°, and said angle of β is 1° to 3° less than the angle α.

* * * * *

UNITED STATES PATENT AND TRADEMARK OFFICE
CERTIFICATE OF CORRECTION

PATENT NO. : 6,220,871 B1
DATED : April 24, 2001
INVENTOR(S) : Otsuki et al.

It is certified that error appears in the above-identified patent and that said Letters Patent is hereby corrected as shown below:

Title page,
Item [30], Foreign Application Priority Data,
"Aug. 7, 1998" should read -- Aug. 17, 1998 --; and "Feb. 24, 1999" should read -- Feb. 12, 1999 --
Item [57], ABSTRACT,
Line 19, "these" should read -- this --

Column 2,
Line 16, "are must be formed" should read -- are formed --
Line 53, "could" should read -- can --
Line 66, "has" should read -- have --

Column 3,
Line 8, "could" should read -- can --
Line 17, "be" should be deleted
Line 49, "a" should be deleted Column 11,
Line 40, "thinner" should read -- thin --

Column 12,
Line 64, "Z0" should read -- $Z_0$ --

Column 13,
Line 24, "trans mission" should read -- transmission --

UNITED STATES PATENT AND TRADEMARK OFFICE
CERTIFICATE OF CORRECTION

PATENT NO. : 6,220,871 B1
DATED : April 24, 2001
INVENTOR(S) : Otsuki et al.

It is certified that error appears in the above-identified patent and that said Letters Patent is hereby corrected as shown below:

Column 19,
Line 13, "The" should read -- An --;

Column 20,
Line 2, "board;" should read -- board; and --

Signed and Sealed this

Eighteenth Day of June, 2002

Attest:

JAMES E. ROGAN
Attesting Officer   Director of the United States Patent and Trademark Office